United States Patent
Nakamura et al.

(10) Patent No.: US 8,077,266 B2
(45) Date of Patent: Dec. 13, 2011

(54) ACTIVE MATRIX SUBSTRATE HAVING INTERLEAVED SOURCE AND DRAIN ELECTRODES ON CIRCLE SEMICONDUCTOR AND DISPLAY DEVICE INCLUDING SAME

(75) Inventors: Kenji Nakamura, Nara (JP); Yoshihiro Okada, Kyoto (JP)

(73) Assignee: Sharp Kabushiki Kaisha, Osaka (JP)

( * ) Notice: Subject to any disclaimer, the term of this patent is extended or adjusted under 35 U.S.C. 154(b) by 34 days.

(21) Appl. No.: 10/935,117

(22) Filed: Sep. 8, 2004

(65) Prior Publication Data
US 2005/0056847 A1 Mar. 17, 2005

(30) Foreign Application Priority Data
Sep. 9, 2003 (JP) .................. 2003-317130

(51) Int. Cl.
*G02F 1/136* (2006.01)
*G09G 3/38* (2006.01)
*H01L 29/04* (2006.01)
(52) U.S. Cl. ................ 349/43; 349/42; 349/46; 345/92; 257/59; 257/72
(58) Field of Classification Search .............. 349/42–47; 345/92; 257/59, 72
See application file for complete search history.

(56) References Cited

U.S. PATENT DOCUMENTS

| | | | | |
|---|---|---|---|---|
| 4,904,056 A | * | 2/1990 | Castleberry | 349/162 |
| 5,798,744 A | * | 8/1998 | Tanaka et al. | 345/92 |
| 5,929,489 A | * | 7/1999 | Deane | 257/347 |
| 5,989,945 A | * | 11/1999 | Yudasaka et al. | 438/149 |
| 6,380,006 B2 | * | 4/2002 | Kido | 438/149 |
| 6,975,367 B2 | * | 12/2005 | Lim | 349/43 |
| 7,167,217 B2 | * | 1/2007 | Yun | 349/43 |
| 2002/0108860 A1 | * | 8/2002 | Staats | 204/601 |
| 2002/0113916 A1 | | 8/2002 | Hashiguchi et al. | |
| 2002/0187573 A1 | * | 12/2002 | Kido | 438/30 |
| 2004/0066483 A1 | * | 4/2004 | Kim | 349/141 |
| 2006/0086937 A1 | * | 4/2006 | Fujii et al. | 257/72 |

FOREIGN PATENT DOCUMENTS

JP 2002-014371 1/2002

OTHER PUBLICATIONS

Kawase et al. "All-Polymer Thin Film Transistors Fabricated by High-Resolution Ink-jet printing" (IEEE 25.5.1-25.5.4 (2000).*

* cited by examiner

*Primary Examiner* — Hoan C Nguyen
(74) *Attorney, Agent, or Firm* — Birch, Stewart, Kolasch & Birch, LLP

(57) ABSTRACT

An active matrix includes (i) a thin film transistor including a semiconductor layer formed above a gate electrode, a source electrode, and a drain electrode, the source electrode and the drain electrode formed to overlap with the semiconductor layer; and (ii) a pixel electrode connected to the drain electrode, a pixel electrode connected to the drain electrode, the drain electrode extended from the pixel electrode into a drain electrode formation region located to be kept within a semiconductor layer formation region, the drain electrode formation region sandwiched between two portions of the source electrode. With this arrangement, even when the semiconductor layers in the TFTs (thin film transistors) have unevenness in sizes, shapes, and/or formation positions thereof, it is possible to prevent occurrence of unevenness (changes) in gate-drain capacitances cgd among the TFTs. Thereby, it is possible to provide an active matrix substrate having a high display characteristic.

36 Claims, 17 Drawing Sheets

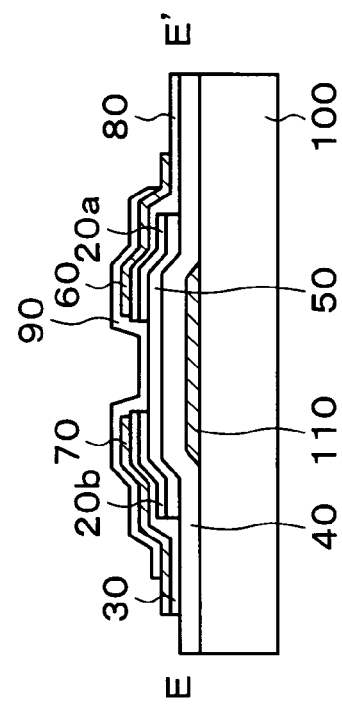
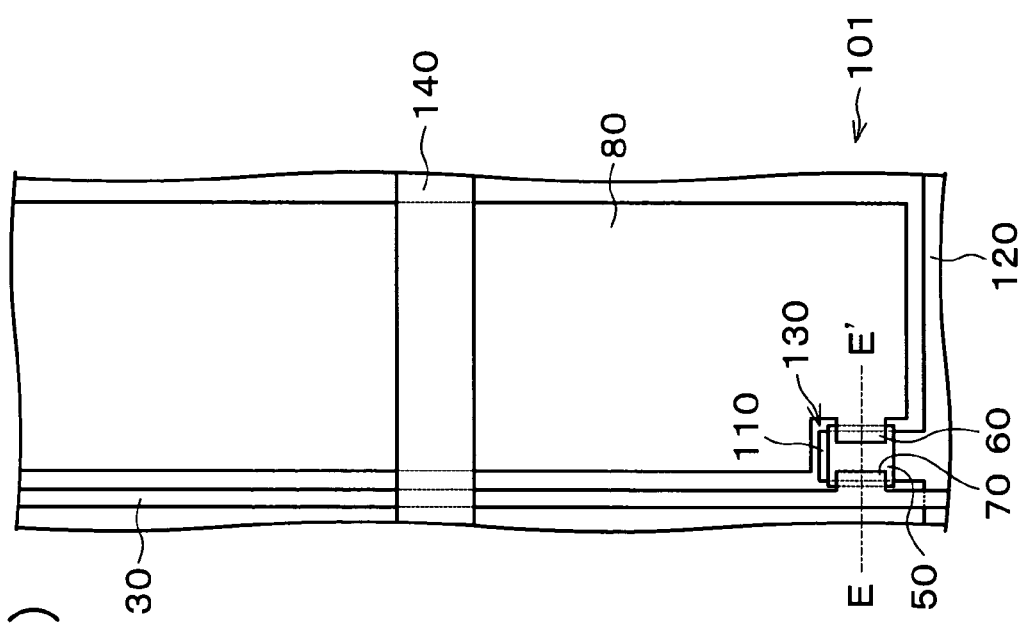

ACTIVE MATRIX SUBSTRATE HAVING INTERLEAVED SOURCE AND DRAIN ELECTRODES ON CIRCLE SEMICONDUCTOR AND DISPLAY DEVICE INCLUDING SAME

This Nonprovisional application claims priority under 35 U.S.C. §119(a) on Patent Application No. 2003/317130 filed in Japan on Sep. 9, 2003, the entire contents of which are hereby incorporated by reference.

FIELD OF THE INVENTION

The present invention relates to an active matrix substrate adopted (i) in a liquid crystal display device such as a liquid crystal television, a liquid crystal monitor, a laptop personal computer, and the like, or (ii) in a display device including an organic EL or the like.

BACKGROUND OF THE INVENTION

A liquid crystal display device is one of the most widely used flat thin display devices at present, and is applied to a laptop personal computer, a liquid crystal television, a liquid crystal television, and the like. A general liquid crystal display device includes two glass substrates on which transparent electrodes are provided, and between which a liquid crystal layer is sandwiched. The liquid crystal layer has transmittance which changes in accordance with voltage applied between an upper electrode and a lower electrode. On this account, by applying voltage to electrodes provided on arbitrary coordinates, a desired image is displayed.

In recent years, products, such as a laptop personal computer, a liquid crystal television, and the like, need a color liquid crystal display device, and most of them have adopted an active matrix liquid crystal display device, in which switching elements such as TFTs (thin film transistors) are used. The active matrix liquid crystal display device includes an active matrix substrate, in which the switching elements and pixel electrodes are provided in matrix, i.e., they are provided in a vicinity of intersections in which signal lines and scanning lines orthogonally cross with one another. An image is displayed by applying voltage to the pixel electrodes via the switching elements such as TFTs. The use of the switching elements makes it easier to control the voltage applied to the liquid crystal layer. Thereby, it becomes possible to attain a display device having a higher contrast, or having a larger number of gradation colors. On this account, the active matrix liquid crystal display device has dramatically higher visibility than a passive matrix liquid crystal display device, which does not include a switching element.

Here, the following description discusses a conventional active matrix substrate (hereinafter, referred to as "first conventional art") with reference to FIG. 10(a) and FIG. 10(b), FIG. 11, and FIG. 12. FIG. 10(a) is a perspective plan view illustrating a structure of an active matrix substrate of the first conventional art. FIG. 10(b) is an explanatory view showing a cross section taken along line E-E' of FIG. 10(a). FIG. 11 and FIG. 12 are enlarged perspective plan views illustrating a TFT (thin film transistor) 130 of the active matrix substrate shown in FIG. 10(b).

As shown in FIG. 10(a) and FIG. 10(b), an active matrix substrate 101 is so arranged that, on a transparent insulation substrate 100 (shown in FIG. 10(b)), a signal line 30, a scanning line 120, a pixel electrode 80, a gate electrode 110, a semiconductor layer 50, a drain electrode 60, and a source electrode 70 are provided.

On the gate electrode 110, a gate insulation film 40 is formed, and on the gate insulation film 40, a semiconductor layer 50 is formed. The semiconductor layer 50 has an end portion (located toward the signal line 30) on which an n-type semiconductor layer 20b is formed. Further, the semiconductor layer 50 has another end portion (located toward the pixel electrode 80) on which an n-type semiconductor layer 20a is formed. On the n-type semiconductor layer 20a, the drain electrode 60 is formed, whereas on the n-type semiconductor layer 20b, the source electrode 70 is formed. Thereby, a TFT having three terminal elements is constituted.

As shown in FIG. 11, the drain electrode 60 and the source electrode 70 face each other, with a certain space between them in such a direction that the scanning line 120 extends. The gate electrode 110 controls electric conduction between the source electrode 70 and the drain electrode 60. For example, when voltage is applied to the gate electrode 110, channel is formed via the n-type semiconductor layers 20a and 20b, and resistance is decreased. Thereby, an electric conduction between the drain electrode 60 and the source electrode 70 is attained.

Note that the gate electrode 110 is connected to the scanning line 120, the source electrode 70 is connected to the signal line 30, and the drain electrode 60 is connected to the pixel electrode 80. Further, an interlayer insulating film 95 is so provided that the interlayer insulating film 95 covers the drain electrode 60, the source electrode 70, and the semiconductor layer 50, which is exposed between the drain electrode 60 and the source electrode 70 facing each other.

Here, the drain electrode 60 and the source electrode 70 need to at least partially overlap with (be formed above) the gate electrode 110. In this case, the gate insulation film 40 and the semiconductor layer 50 are interposed between them. A region (cgd contribution region) 90, an area of which determines a gate-drain capacitance cgd, is constituted of (a) that overlapping portion of the drain electrode 60 which overlaps with the semiconductor layer 50, (b) that overlapping portion of the gate electrode 110 which overlaps with the semiconductor layer 50, and (c) vicinities of those overlapping portions of the drain electrode 60 and the gate electrode 110. The gate-drain capacitance cgd has a great effect on a display characteristic of a liquid crystal display device.

Therefore, it is necessary that the areas of the cgd contribution areas 90 of the TFTs formed on the active matrix substrate 101 should not be greatly different from what it is supposed to be (designed value), that is, it is necessary to suppress unevenness among the areas of the cgd contribution regions 90 of the TFTs formed on the active matrix substrate 101. In order to avoid the unevenness among the cgd contribution areas 90, it is necessary to carry out an accurate positional alignment with tolerance of not more than ±several μm between (i) an electrode layer including the drain electrode 60 and a source electrode 70 and (ii) an electrode layer including the gate electrode 110. Note that, in an actual manufacturing step, positional alignment for an exposure device is so accurate that its tolerance is ±1 μm or less.)

Incidentally, in recent years, use of an ink jet printing is becoming popular way of manufacturing the active matrix 101.

Unlike a conventional photolithography method, the ink jet printing possibly causes not only the problem of misalignment of the electrode layers, but also such a problem that sizes and/or shapes of patterns thereof become different (deviated) from what they are supposed to be (from its designed value), due to miss-shot of the droplets (the droplets are inaccurately shot and land off of a predetermined positions of the TFTs), which causes unevenness among the droplets in terms of their shapes.

For example, when the ink jet printing is carried out to form a resist pattern in a step of forming the semiconductor layer 50, there is a possibility that misalignment occurs and/or the pattern deviates in terms of its size and shape. This leads to deviation in the area of the cgd contribution region 90 (the region that includes (a) those portions of the drain electrode 60 and the gate electrode 110 which overlap with each other, and (b) a vicinity of those portions). The deviation in the area of the cgd contribution region 90 results in deviation in the gate-drain capacitance cgd. Accordingly, the gate-drain capacitances cgd among the TFTs becomes uneven with one another. This adversely affects a display characteristic of the liquid crystal display device.

Therefore, for forming the active matrix substrate 101 by using the ink jet printing as described above, it is necessary to have such an arrangement that the cgd contribution region 90 would not be greatly different from what it is supposed to be, even if misalignment occurred or the pattern was different from what it is supposed to be, in terms of sizes and shapes.

However, with the foregoing first conventional art, the cgd contribution region 90 becomes greatly different from its designed value when misalignment occurs.

For example, as shown in FIG. 12, when the semiconductor layer 50 has a size different from what it is supposed to be (the semiconductor layer 50 has a smaller area which is reduced at its side facing the scanning line 120), the area of the cgd contribution region 90 becomes greatly different from what it is supposed to be.

Further, in FIG. 11, when the formation position of the semiconductor layer 50 is shifted in a length of X (indicated by an arrow in FIG. 11) toward the source electrode 70, the region in which the drain electrode 60, the gate electrode 110, and the semiconductor layer 50 overlap with one another loses almost half of its area. Further, when the formation position of the semiconductor layer 50 is shifted in a length of Y (indicated by an arrow in the figure) toward the source electrode 70, it becomes impossible to form the channel between the drain electrode 60 and the source electrode 70. This adversely affects the display characteristic of the liquid crystal display device.

In view of the misalignment between the layers, Japanese Laid-Open Patent Application Tokukai 2002-14371 (published on Jan. 18, 2002; hereinafter, referred to as "Reference 1"), for example, discloses an arrangement (hereinafter, referred to as the second conventional art) in which a wider margin for the alignment is provided.

FIG. 13(a) is a perspective plan view illustrating a structure of an active matrix substrate 101 of the second conventional art. FIG. 13(b) is an explanatory view showing cross section taken along line F-F' in the FIG. 13(a). FIG. 14 to FIG. 16 are enlarged perspective plan views illustrating a TFT (thin film transistor) 130 of the active matrix substrate 101 (shown in FIG. 13(a)). Note that, for ease of explanation, sections having the equivalent functions as those shown in the active matrix substrate shown in FIG. 10(a) and FIG. 10(b) will be given the same reference symbols.

The second conventional art is different from the first conventional art in terms of the shape of the drain electrode 60 and the shape (formation region) of the semiconductor layer 50. Namely, as shown in FIG. 14, the drain electrode 60 includes a counter portion 60a that faces the source electrode 70, and a connecting portion 60b that connects the counter section 60a to the pixel electrode 80. The drain electrode 60 has a T-shape, i.e., the connecting portion 60b has a smaller width than the counter portion 60a. Further, the semiconductor layer 50 is formed under the source electrode 70 and the drain electrode 60, and has such a shape that the semiconductor layer 50 has an area whose margin surrounds the drain electrode 60 and the source electrode 70. Specifically, the semiconductor layer 50 includes (i) a region 50a whose margin surrounds the source electrode 70 and the counter portion 60a of the drain electrode 60, and (ii) a region 50b whose margin surrounds the connecting portion 60b of the drain electrode 60.

With this arrangement, even if a photolithography device is misaligned in forming the patterns of the gate electrode 110, the drain electrode 60, and the source electrode 70, resultant deviation in the area of the region that includes (a) the overlapping portion of the drain electrode 60, and (b) the overlapping portion of the gate electrode 110 is smaller than in the first conventional art.

For example, when, in FIG. 14, the formation position of the semiconductor layer 50 is shifted in a length of X (indicated by an arrow in FIG. 14) toward the source electrode 70, the area of the overlapping portion of the drain electrode 60 and the overlapping portion of the gate electrode 110 is still reduced, however, the area is less reduced than in the first conventional art because the connecting potion 60b of the drain electrode 60 has a smaller width than the counter portion 60a. Further, even when the formation position of the semiconductor layer 50 is shifted in a length of Y (indicated by an arrow in FIG. 14) toward the source electrode 70, the channel can be formed, unlike in the first conventional art, because the semiconductor layer 50 includes the region 50b which has a shape having a margin surrounding the connecting portion 60b.

This suppresses a display defect even when the misalignment occurs.

However, the second conventional art does not completely prevent the deviation in the gate-drain capacitances cgd when the pattern of the semiconductor layer 50 is different, in terms of size and shape, from what it is supposed to be.

For example, when the semiconductor layer 50 has a size different from what it supposes to be, (the semiconductor layer 50 has a smaller size, that is, reduced in size at a side facing the scanning line 120) as shown in FIG. 15, or when the semiconductor layer 50 has a shape different from what it is supposed to be (the semiconductor layer 50 becomes a circular shape) as shown in FIG. 16, the area of the cgd contribution region 90 is greatly changed.

As described above, the conventional arts can hardly suppresses the gate-drain capacitances cgd from being changed when the sizes or the shapes of the semiconductor layers deviate from what they are supposed to be, for example, in forming the active matrix substrate by using the ink jet printing.

SUMMARY OF THE INVENTION

The present invention is made in view of the foregoing conventional problems, and the present invention provides an active matrix substrate in which unevenness in the gate-drain capacitances cgd among the TFTs can be prevented even when a size and/or a shape of a semiconductor layer is deviated (whereby semiconductor layers in the TFTs have unevenness in sizes and/or shapes), and which can have a high display characteristic even when such deviation (unevenness) in the size and/or the shape of the semiconductor layer occurs.

An active matrix substrate according to the present invention is provided with: a scanning line on a substrate, the scanning line including a gate electrode; a thin film transistor including (a) a semiconductor layer formed above the gate electrode, (b) a source electrode, and (c) a drain electrode, the source electrode and the drain electrode formed to overlap with the semiconductor layer; a signal line that is connected to the source electrode, and that crosses with the scanning line; and a pixel electrode connected to the drain electrode, the drain electrode extended from the pixel electrode into a drain electrode formation region located to be kept within a semiconductor layer formation region, the drain electrode formation region surrounded by a portion of the source electrode or sandwiched between a plurality of portions of the source electrode.

In an active matrix substrate, data from a signal line is written in a pixel electrode by using a switching element such as a TFT (thin film transistor). Specifically, when a gate electrode receives a signal from a scanning line, the gate electrode forms a source-drain channel. Then, the data (voltage) from the signal line is written in (applied to) the pixel electrode via the source electrode and the drain electrode.

In the arrangement, the drain electrode extends from the drain electrode into the drain electrode formation region. The drain electrode formation region is surrounded by the source electrode having one portion of the source electrode, or is sandwiched between the plurality of portions of the source electrode. The source electrode is formed in a periphery of (or has the portions that sandwiches) the drain electrode. The semiconductor layer is formed so that the drain electrode and the source electrode are formed within the semiconductor layer when seeing from above. The channel is formed in the periphery (or both sides) of the drain electrode.

Therefore, a region (cgd contribution region) that includes (a) those portions of the drain electrode and the gate electrode which overlap with each other, and (b) a vicinity of those portions (i.e., a region constituted of (i) those portions of the gate electrode and, the drain electrode, and the semiconductor layer in which they overlap with one another, and (ii) a vicinity of their portions) is disposed in a region that nearly corresponds to the central portion of the semiconductor layer. On this account, even when the size, the shape, or the formation position of the semiconductor layer is changed, the area of the cgd contribution region can be significantly prevented from changing or be less changed.

Further, the cgd contribution region (the region that includes (a) those portions of the drain electrode and the gate electrode which overlap with each other, and (b) a vicinity of those portions) is sandwiched between the portions of the source electrode, thereby stabilizing the cgd contribution region.

Further, according to the arrangement, the cgd contribution region has a certain distance from each end of the semiconductor layer. On this account, even when the size and/or the shape of the semiconductor layer is deviated, and/or a formation position of the semiconductor layer is shifted, it is possible to avoid or minimize the change in the area of the cgd contribution region.

On this account, the gate-drain capacitance cgd in each thin film transistor is less changed (the gate-drain capacitances cgd among the thin film transistors less vary), thereby realizing a high display characteristic.

Additional features and strengths of the present invention will be made clear by the description below. Further, the advantages of the present invention will be evident from the following explanation in reference to the drawings.

BRIEF DESCRIPTION OF THE DRAWINGS

FIG. 10(a) is a perspective plan view illustrating a structure of an active matrix substrate of the first conventional art. FIG. 10(b) is an explanatory view showing a cross section taken along line E-E' in FIG. 10(a).

DESCRIPTION OF THE EMBODIMENTS

The following description deals with one embodiment of the present invention with reference to figures.

Figure 17:
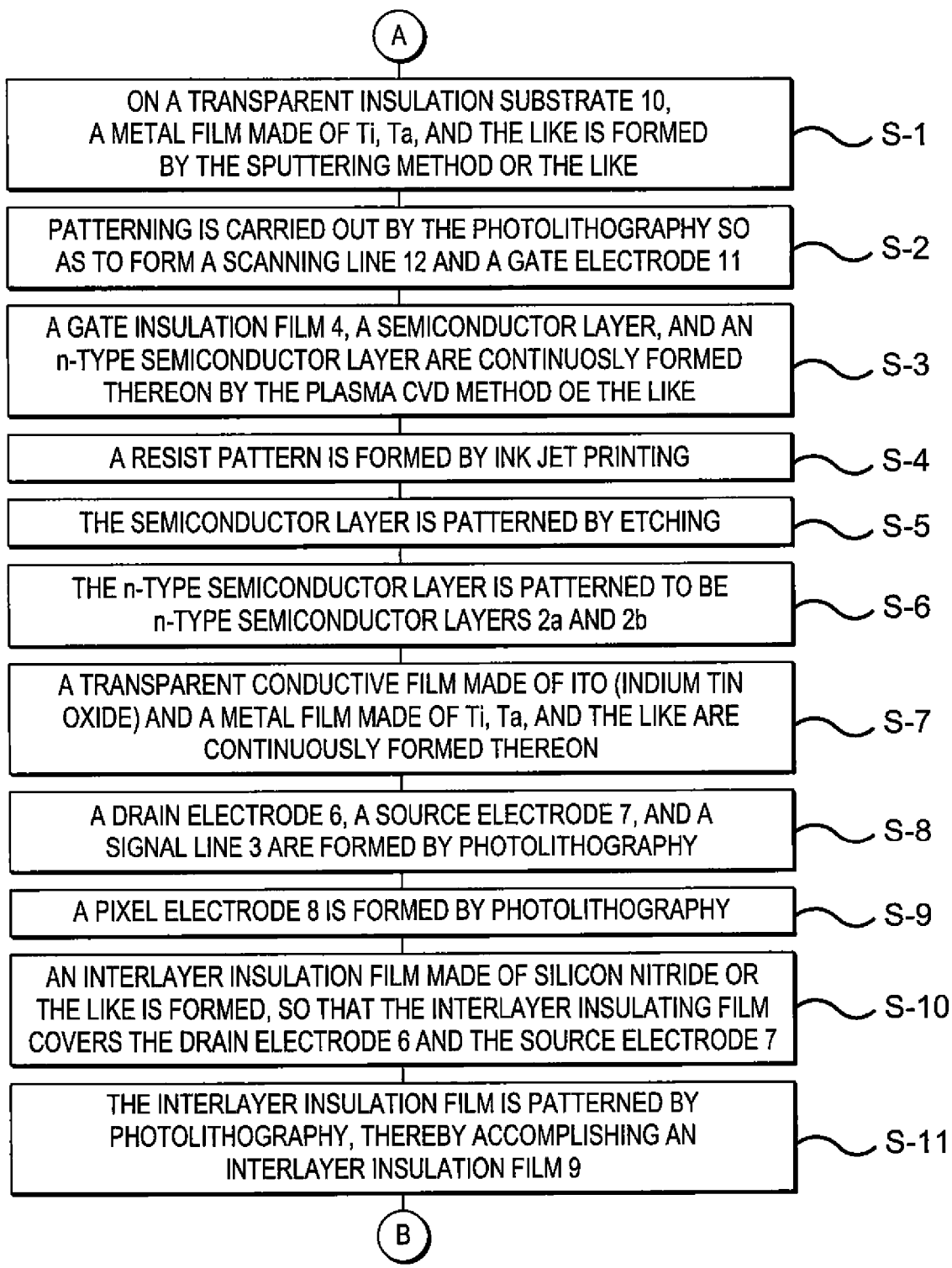
FIG. 17 is a flow diagram for the method for manufacturing the active matrix substrate shown in FIGS. 1(a) and 1(b).

Firstly, in the present embodiment, a method for manufacturing an active matrix substrate is described with reference to FIGS. 1(a) and 1(b), with corresponding steps shown in FIG. 17.

Figure 1:
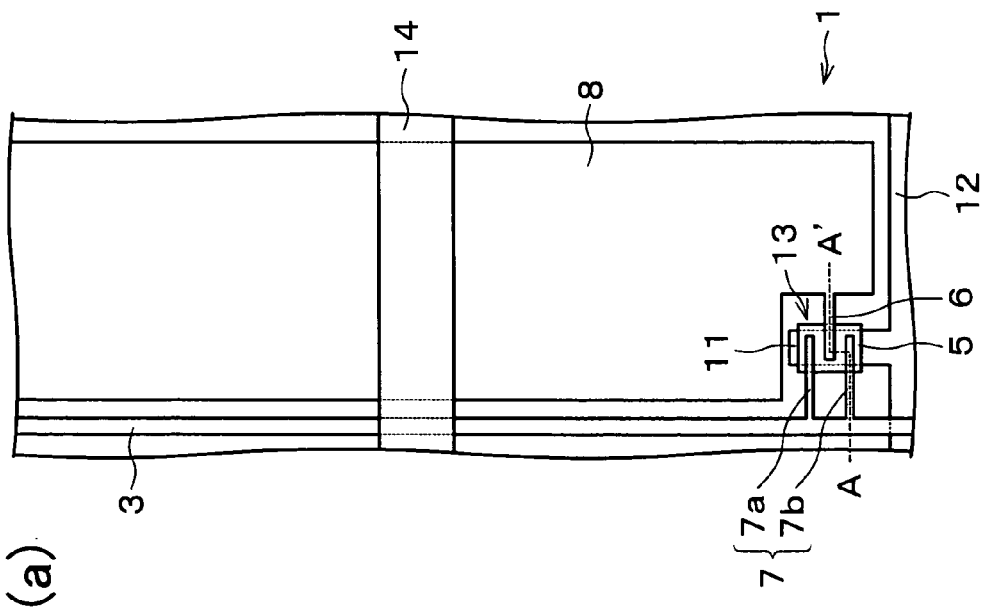
FIG. 1(a) is a perspective plan view illustrating a structure of an active matrix substrate of the present invention.
FIG. 1(b) is a explanatory view showing a cross section taken along line A-A' in FIG. 1(a).
Figure 1:
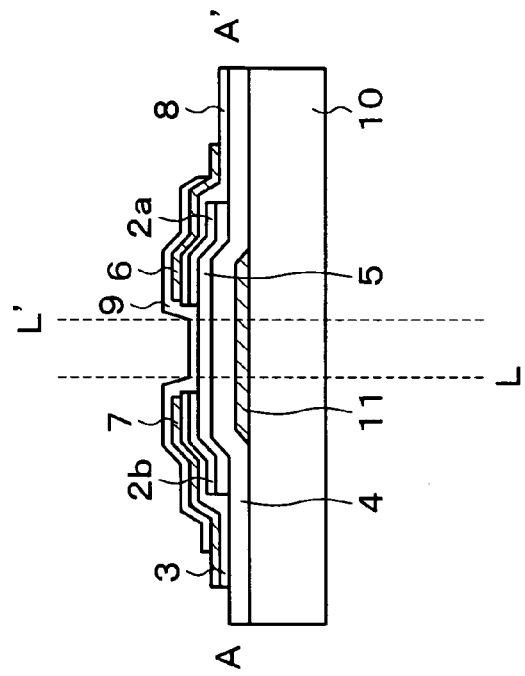

Here, FIG. 1(a) is a perspective plan view illustrating an active matrix substrate of the present invention, and FIG. 1(b) is an explanatory view showing a cross section taken along line A-A' in FIG. 1(a).

Firstly, on a transparent insulation substrate 10 (shown in FIG. 1(b)), a metal film made of Ti, Ta, and the like is formed by the sputtering method or the like (Step S-1), then patterning is carried out by the photolithography so as to form a scanning line 12 and a gate electrode 11 (Step S-2).

Next, a gate insulation film 4, a semiconductor layer, and an n-type semiconductor layer are continuously formed thereon by the plasma CVD method or the like (Step S-3), then a resist pattern is formed by ink jet printing (Step S-4). Thereafter, the semiconductor layer is patterned by etching (Step S-5), and then a semiconductor layer 5 is obtained. Also, the n-type semiconductor layer is patterned to be n-type semiconductor layers 2a and 2b (Step S-6). Note that the resist pattern may be formed by the photolithography method.

Then, a transparent conductive film made of ITO (indium tin oxide) and a metal film made of Ti, Ta, and the like are continuously formed thereon (Step S-7), and a drain electrode 6, a source electrode 7, and a signal line 3 are formed by photolithography (Step S-8). After that, a pixel electrode 8 is formed by photolithography (Step S-9).

Next, an interlayer insulation film made of silicon nitride or the like is formed, so that the interlayer insulating film covers the drain electrode 6 and the source electrode 7 (Step S-10). Then the interlayer insulation film is patterned by photolithography, thereby accomplishing an interlayer insulation film 9 (Step S-11).

Thereby, an active matrix substrate 1 is fabricated.

Then, the active matrix substrate 1 is assembled with a counter electrode substrate including a transparent electrode (not shown), a color filter (not shown), and the like, or with a counter electrode substrate including a transparent electrode, and then, between the active matrix substrate 1 and the counter electrode substrate, a liquid crystal is injected, thereby constructing a liquid crystal display device of the present embodiment.

Next, description of a structure of the active matrix substrate 1 is made with reference to FIGS. 1(a) and 1(b), FIG. 2, FIGS. 3(a) and 3(b), FIG. 4, and FIG. 9.

Figure 2:
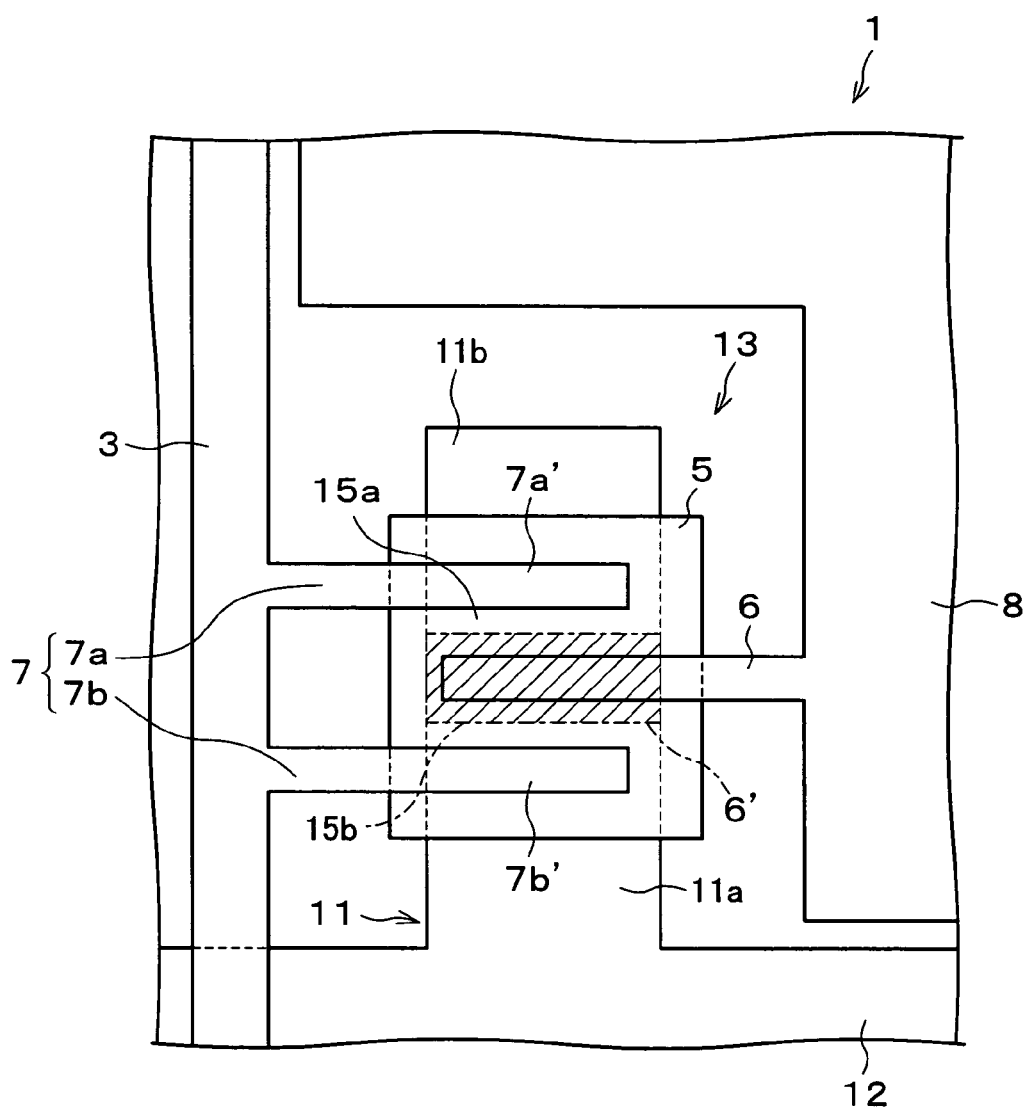
FIG. 2 is an enlarged perspective plan view illustrating a structure of a TFT of the active matrix substrate shown in FIG. 1(a).

FIG. 2 is an enlarged perspective plan view of a TFT (thin film transistor) 13 of the active matrix substrate 1 (shown in FIG. 1(a)).

As shown in FIGS. 1(a) and 1(b), the active matrix substrate 1 is so arranged that, on the transparent insulation substrate 10 (substrate; shown in FIG. 1(b)), the signal line 3, the scanning line 12, the pixel electrode 8, the gate electrode 11, the semiconductor layer 5, the drain electrode 6, the source electrode 7 (having portions 7a and 7b), and a Cs (storing capacitor) 14 serving as an additional capacitor are formed.

The signal line 3 and the scanning line 12 orthogonally cross with each other with the gate insulation film 4 (shown in FIG. 1(b)) interposed between them. In a vicinity of their intersection, the TFT (thin film transistor) 13 having three terminal elements (the gate electrode 11, the drain electrode 6, and the source electrode 7) is formed, and is adjacent to the pixel electrode 8. The pixel electrode 8 has a portion facing the signal line 3 with the TFT 13 interposed between them. The gate electrode 11 of the TFT 13 protrudes, from the scanning line 12, in such a direction that the signal line 3 extends. Further, the drain electrode 6 is electrically connected to the pixel electrode 8, and the source electrode 7 is electrically connected to the signal line 3.

In the active matrix substrate 1, the TFT 13 serves as a switching element. In accordance with a signal (addressing signal) supplied to the scanning line 12, data (voltage) from the signal line 3 is written in (applied to) the pixel electrode 8 via the source electrode 7 and the drain electrode 6.

Hereinafter, the structure of the TFT 13 is described. Note that, in FIG. 1(b), a cross section taken along the source electrode 7 (the portion 7b) is shown on a left hand side (in which the signal line 3 is provided) of a broken line L, and a cross section taken along the drain electrode 6 is shown on a right hand side (in which the pixel electrode 8 is provided) of a broken line L'.

As shown in FIG. 1(b), in the TFT 13, the gate electrode 11 is formed on the transparent insulation substrate 10, and the gate insulation film 4 is formed on the gate electrode 11. On the gate insulation film 4, the semiconductor layer 5 is formed. Further, on the semiconductor layer 5, the n-type semiconductor layers 2a and 2b are formed. On the n-type semiconductor layer 2a, the drain electrode 6 is formed, whereas on the n-type semiconductor layer 2b, the source electrode 7 is formed. The drain electrode 6 is connected to the pixel electrode 8, and the source electrode 7 is connected to the signal line 3. On the drain electrode 6 and the source electrode 7, the interlayer insulation film 9 is so formed that the interlayer insulation film 9 covers the drain electrode 6 and the source electrode 7.

It should be noted that, in the TFT 13 of the present embodiment, the drain electrode 6 having one portion extends, from the pixel electrode 8, along a direction of the scanning line 12. The drain electrode 6 has a slender rectangular shape (strip-like shape) as shown in FIG. 2. Note that the drain electrode 6 extends, toward the signal line 3, beyond a center of a formation region of the semiconductor layer 5, the formation region being a region in which the semiconductor layer 5 is formed.

Meanwhile, the source electrode 7 having two portions 7a and 7b extends, from the signal line 3, along the direction of the scanning line 12. Namely, the source electrode 7 extends inversely with respect to the drain electrode 6. The portions 7a and 7b each have slender rectangular shapes (strip-like shapes). Note that the source electrode 7 extends, toward the pixel electrode 8, beyond the center of the formation region of the semiconductor layer 5.

The portions 7a and 7b of the source electrode 7 thus extends from the signal line 3 to the formation region of the semiconductor layer 5, and the portions 7a and 7b each has rectangle shapes (strip-like shapes). Further, the portions 7a and 7b respectively have parts 7a' and 7b', between which the drain electrode 6 is sandwiched, the drain electrode 6 extending from the connecting portion connecting the drain electrode 6 to the pixel electrode 8. The region sandwiched between the parts 7a' and 7b' is a drain electrode formation region.

In other words, the drain electrode 6 is interleaved with the parts 7a' and 7b' of the source electrode 7 within the formation region of the semiconductor layer 5. A region between the part 7a' and the drain electrode 6 mainly becomes a channel region 15a, and a region between the part 7b' and the drain electrode 6 mainly becomes a channel region 15b.

Further, the semiconductor layer 5 has such a quadrangular shape that the parts 7a' and 7b' of the source electrode 7, and the channel regions 15a and 15b (when viewed from above) are surrounded by a sufficient margin of the semiconductor layer 5. That is, the semiconductor layer 5 has a shape of a sufficient dimension such that the parts 7a' and 7b' of the source electrode 7, and the channel regions 15a and 15b formed by the drain electrode 6 interleaved within the parts 7a' and 7b' of the source electrode 7 will overlap with the semiconductor layer 5. Further, under the semiconductor layer 5, the gate electrode 11 extended from the scanning line 12 has such a shape whose margin surrounds the parts 7a' and 7b' of the source electrode 7, and the channel regions 15a and 15b (when seeing from above). That is, the gate electrode 11 has a shape of a sufficient dimension such that the parts 7a' and 7b' of the source electrode 7, and the channel regions 15a and 15b formed by the drain electrode 6 interleaved within the parts 7a' and 7b' of the source electrode 7 will be within the gate electrode 11 so as to overlap the gate electrode 11.

In the arrangement, the gate electrode 11, connected to the scanning line 12, controls electric conduction between the potion 7a and the drain electrode 6, and electric conduction between the portion 7b and the drain electrode 6, the portions 7a and 7b of the source electrode 7 being juxtaposed with each other. For example, when voltage is applied to the gate electrode 11 via the scanning line 12, the source-drain channel is formed in the channel regions 15a and 15b of the semiconductor layer 5 via the n-type semiconductor layers 2a and 2b (shown in FIG. 1(b)), thereby attaining electric conduction between the drain electrode 6 and the source electrode 7.

In FIG. 2, the numerical reference 6' is a region (cgd contribution region) attained by projecting, onto the semiconductor layer 5, (a) those portions of the drain electrode 6 and the gate electrode 11 which overlap with each other, and (b) a vicinity of those portions (i.e., the region 6' is constituted of (i) those portions of the gate electrode 11 and the drain electrode 6 in which they overlap with one another, and (ii) a vicinity of these portions). According to the present embodiment, the cgd contribution region 6' is disposed in a region that corresponds to the central portion of the semiconductor layer 5 as shown in FIG. 2. With this arrangement, even when the size or the shape of the semiconductor layer 5 deviates, and/or when the formation position of the semiconductor layer 5 is shifted in a direction (channel direction) of the signal line 3, the area of the cgd contribution region 6' can be significantly prevented from changing.

Further, in the arrangement, the cgd contribution region 6' (the region attained by projecting, onto the semiconductor layer 5, (a) those portions of the drain electrode 6 and the gate electrode 11 which overlap with each other, and (b) a vicinity of those portions) is sandwiched between the portions 7a and 7b of the source electrode 7, thereby stabilizing the cgd contribution region 6'.

Further, regarding the direction along the scanning wire 12 (the direction orthogonal to the direction in which the channel is formed), the drain electrode 6 can have a smaller width (a length along a direction of the signal line 3) than the conventional arts because the drain electrode 6 has a strip-like shape in the formation region of the semiconductor layer 5. On this account, the area of the cgd contribution region 6' is also prevented from changing when the size and/or the shape of the semiconductor layer 5 deviates, and/or the formation position of the semiconductor layer 5 is shifted along the direction of the scanning wire 12.

Further, in the arrangement, the cgd contribution region 6' has a certain distance from each edge of the semiconductor layer 5 (when seeing from above). On this account, even when the size, the shape, and/or the formation position of the semiconductor layer 5 deviates from what they are supposed to be, it is possible to avoid or minimize the change in the area of the cgd contribution region 6'.

As described above, the present embodiment makes it possible to avoid or minimize the change in the area of each cgd contribution region 6' even when the size and/or the shape of the semiconductor layer 5 is deviated, and/or the formation position of the semiconductor layer 5 is shifted along the directions of the scanning line 12 and the signal line 3.

On this account, it is possible to suppress the change in the gate-drain capacitance cgd in each thin film transistor 13, that is, unevenness among the gate-drain capacitances cgd, thereby realizing a high display characteristic.

Further, because the source electrode 7 (each of the portions 7a and 7b) has such a simple slender rectangular shape (strip-like shape) that extends from the signal line 3 to the formation region of the semiconductor layer 5, it is easy to form (pattern) the source electrode 7.

Note that, in the present embodiment, it is preferable that the semiconductor layer 5 has regions under which the gate electrode 11 is not formed, one of the regions is located toward the source electrode 7 (signal line 3), and the other area located toward the drain electrode 6 (pixel electrode 8). This is for preventing leakage (unintended flow of voltage) when electric resistance is decreased by light irradiated on the semiconductor layer 5, the light being emitted from a back lighting device used for a liquid crystal display device or the like.

In the present embodiment, as shown in FIG. 2, the gate electrode 11 extends from the scanning line 12 to the formation region of the semiconductor layer 5, and has a connecting portion (initial end portion) 11a, and a top end potion (final end portion) 11b. The connecting portion 11a is connected to the scanning line 12, and the top end potion 11b and the connecting portion 11a sandwich the drain electrode 6 therebetween. Namely, the gate electrode 11 is so arranged that the connecting portion 11a and the top end portion 11b do not overlap with the semiconductor layer 5. Further, the semiconductor layer 5 has areas under which the gate electrode 11 is not formed, one of the areas located toward the drain electrode 6, and the other area located toward the source electrode 7 (thus, the semiconductor layer 5 is so arranged that the areas there of under which the gate electrode 11 is not formed is divided by the area thereof under which the gate electrode 11 is formed). This arrangement prevents leakage between the drain electrode 6 and the source electrode 7. This avoids electrical change of the pixel electrode 8.

Here, the active matrix substrate 1 having a structure of the present embodiment, and the active matrix substrate 101 (shown in FIG. 10(a)) having a structure of the aforementioned first conventional art were manufactured. In each of them, the size and the formation position of each semiconductor layer 5 (50) was intentionally deviated/shifted. Specifically, one side of the semiconductor layer 5 (50) was shifted in the length of ±3 μm from its designed value, and its formation position was shifted in a length of ±3 μm in any direction from its designed value.

In a liquid crystal display device including the active matrix substrate 101 of the first conventional art, flicker was observed. On the contrary, in a liquid crystal display device including the active matrix substrate 1 of the present embodiment, it was observed that a flicker occurred much less than in the conventional liquid crystal display device including the active matrix substrate 101.

Figure 9:
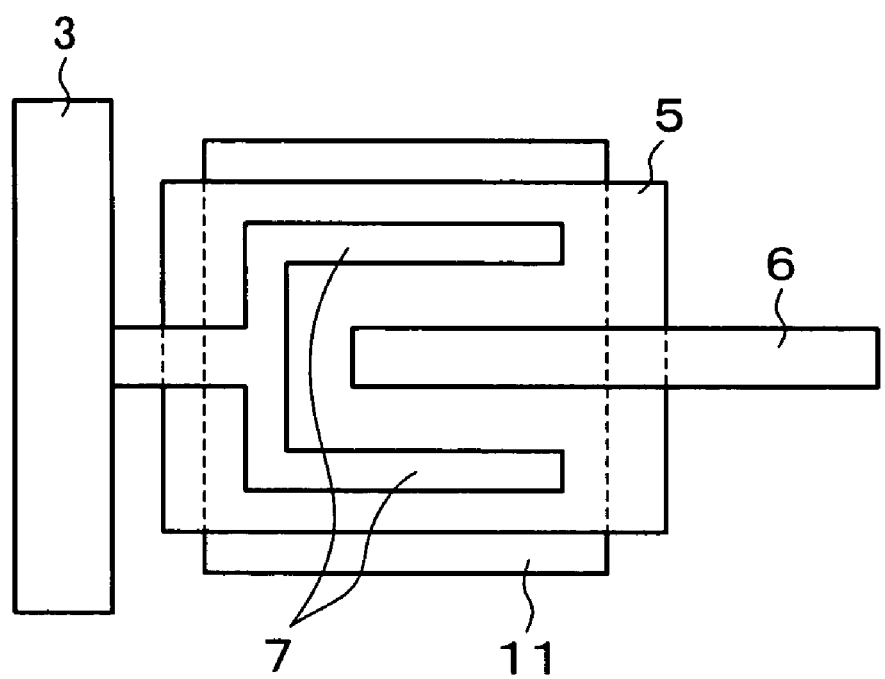
FIG. 9 is a perspective plan view illustrating a frame format of still another structure of the TFT of the active matrix substrate shown in FIG. 1(a).

Note that the present embodiment is not limited to the arrangement in which the source electrode 7 has two portions, which are unbranched and directly connected to the signal wire 3. For example, as shown in FIG. 9, the source electrode 7 may be branched so that the source electrode 7 has branched-out portions that are branched out from (and connected to) a connecting portion, and the branched-out portions are connected to the signal wire 3.

Further, the shape of the semiconductor layer 5 is not limited to the quadrangle (rectangle), and may have a circular shape or an elliptical shape. It is possibly much easier to form the semiconductor layer 5 having a circular shape than the semiconductor layer 5 having a quadrangular (rectangular) shape when the resist pattern is formed by the ink jet printing so as to pattern the semiconductor layer 5.

Figure 3:
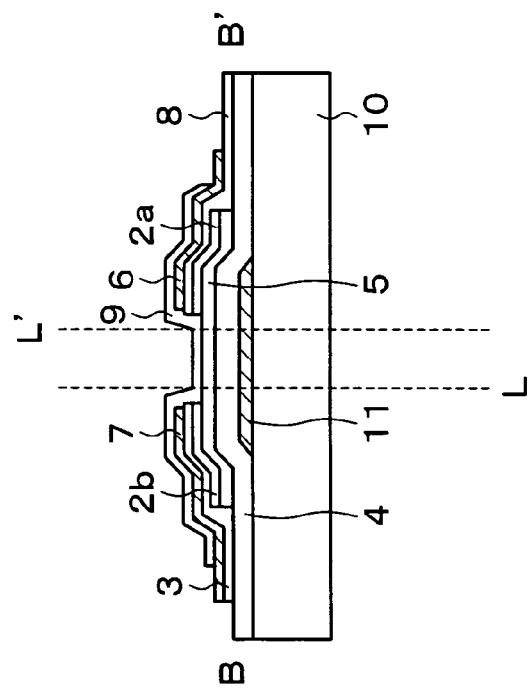
FIG. 3(a) is a perspective plan view illustrating another structure of the active matrix substrate of the present invention.
FIG. 3(b) is an explanatory view showing a cross section taken along line B-B' in FIG. 3(a).
Figure 3:
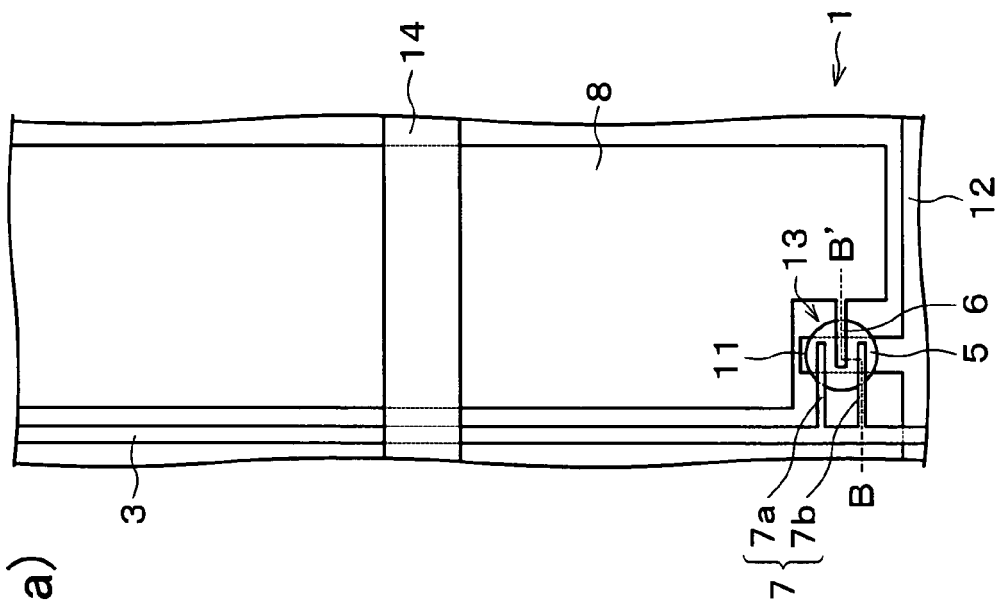
Figure 4:
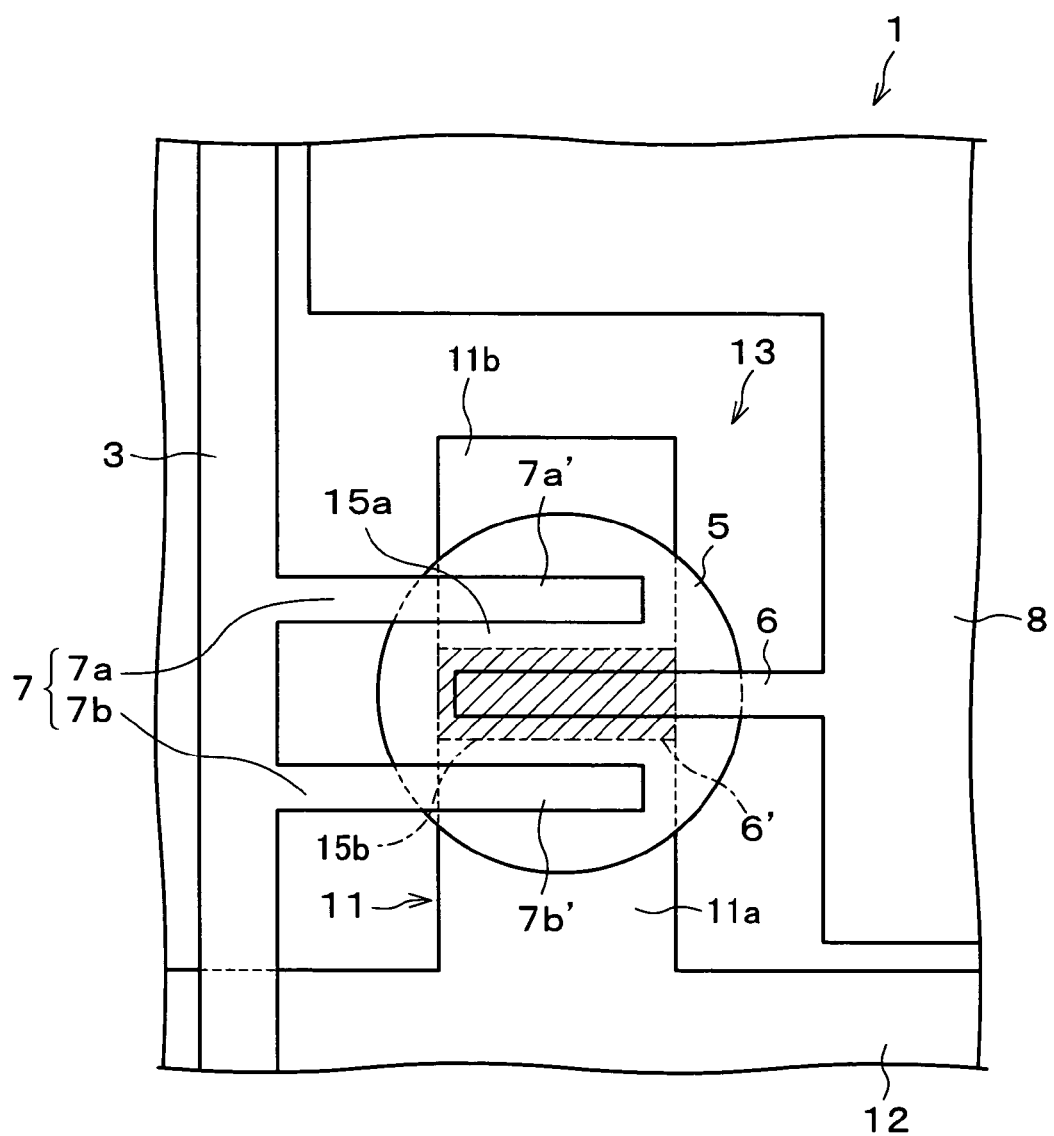
FIG. 4 is an enlarged perspective plan view illustrating the structure of a TFT of the matrix substrate shown in FIG. 3(a).

Here, FIGS. 3(a), 3(b), and 4 shows an arrangement in which a semiconductor layer 5 has a circular shape in the present embodiment. FIG. 3(a) is a perspective plan view illustrating an active matrix substrate 1 having the structure. FIG. 3(b) is an explanatory view showing a cross section taken along line B-B' in the FIG. 3(a). FIG. 4 is an enlarged perspective plan view illustrating the TFT (thin film transistor) 13 of the active matrix substrate 1 shown in FIG. 3(a).

Note that, in FIG. 3(b), a cross section taken along a source electrode 7 (portion 7b) is shown on a left hand side (in which a signal line 3 is provided) of a broken line L (shown in FIG. 3(b)), and a cross section taken along a drain electrode 6 is shown on the right hand side (where the pixel electrode 8 is provided) of a broken line L' (shown in FIG. 3(b)).

In this case, a TFT 13 has a lamination structure same as in the foregoing arrangement of FIG. 1(b). The source electrode 7 and the drain electrode 6 have the same shapes as those in the arrangement, respectively. Specifically, the source electrode 7 has two portions 7a and 7b each extending from the signal line 3 along a direction of a scanning line 12, and the portions 7a and 7b have parts 7a' and 7b', respectively. Between the portions 7a and 7b, the drain electrode 6 is formed. (Therefore, the region between the portions 7a and 7b of the source electrode 7 is the drain electrode formation region.) The drain electrode 6 has one portion, and is connected to a pixel electrode 8. Further, a region between the part 7a' and the drain layer 6 is a channel region 15a, and a region between the part 7b' and the drain layer 6 is a channel region 15b. A gate electrode 11 is so extended from the scanning line 12 that the channel regions 15a and 15b are formed within the gate electrode 11 (when viewed from above).

In this arrangement, the semiconductor layer 5 is so formed above the gate electrode 11 as to have a circular shape of sufficient size margin to surround the channel regions 15a and 15b (when seeing from above) (In other words, the margins of the semiconductor layer 5 is sufficient to surround the channel regions 15a and 15b).

Because the semiconductor layer 5 thus has a circular shape, the formation of the resist pattern by using the ink jet printing can be easily performed in the step of forming the semiconductor layer 5.

Figure 16:
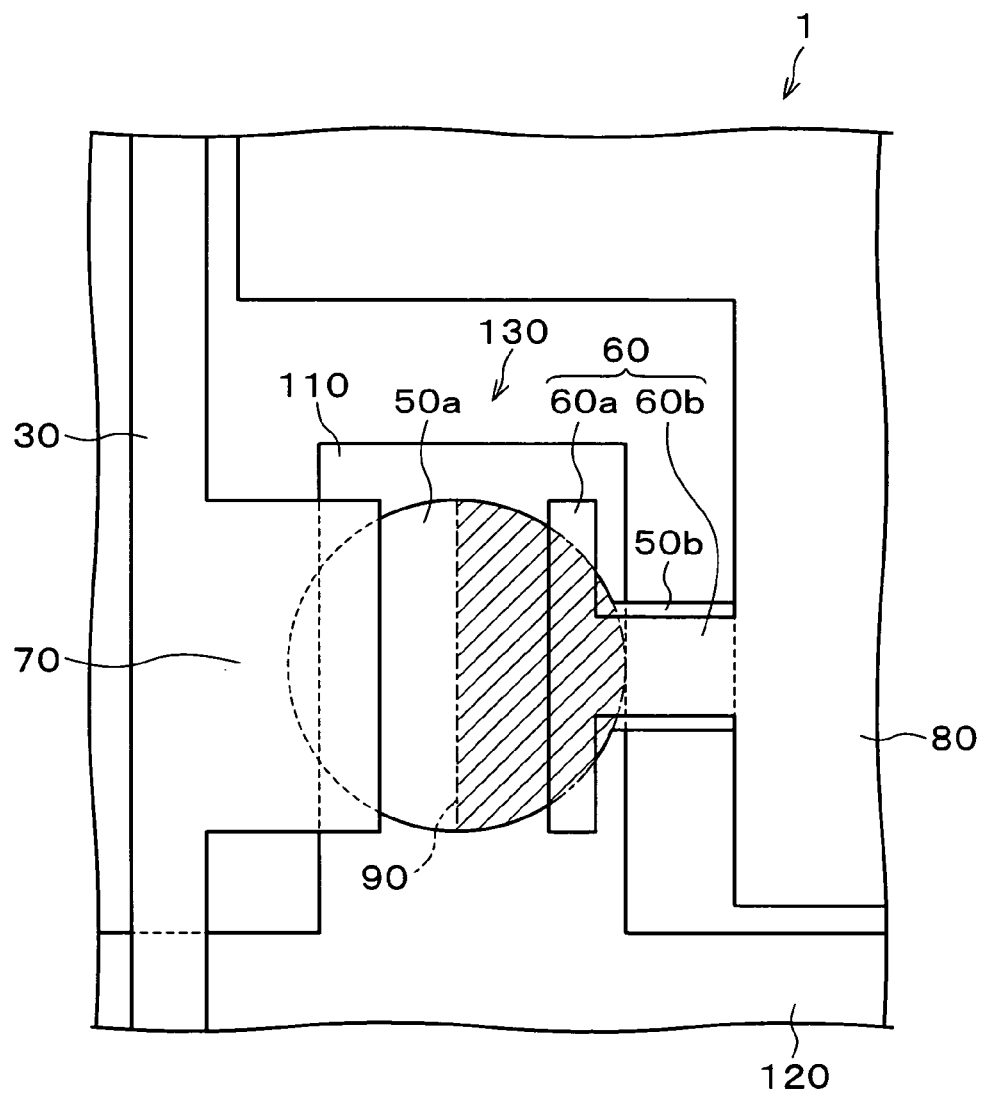
FIG. 16 is a perspective plan view illustrating a change in shape of the semiconductor layer of the active matrix substrate shown in FIG. 13(a).

Meanwhile, in the case of the conventional art in which the semiconductor layer 5 has a circular shape as shown in FIG. 16, the gate-drain capacitance cgd is greatly changed, and flicker is possibly caused when the size or the like of the semiconductor layer 50 is deviated and/or a position of the semiconductor layer 50 is shifted.

On the contrary, the present embodiment is so arranged that the drain electrode 6 is interleaved within the two portions 7a and 7b of the source electrode 7 and a cgd contribution region 6' is disposed in a region that corresponds to the central portion of the circle of the semiconductor layer 5. (The cgd contribution region 6' is region that includes (a) those portions of the drain electrode 6 and the gate electrode 11 which overlap with each other, and (b) a vicinity of those portions). With this arrangement, even when the size and/or the shape of the semiconductor layer 5 is deviated, or the formation position of the semiconductor layer 5 is shifted in any direction, it is possible to avoid a change in the gate-drain capacitance cgd.

Here, the active matrix substrate 1 of the present embodiment, and the active matrix substrate 101 (shown in FIG. 10(a)) of the first conventional art were manufactured. In each of the active matrix substrates 1 and 101, the resist pattern was formed, by using the ink jet printing, so as to form the semiconductor layer 5 having a circular shape.

Note that the resist pattern of the semiconductor layer 5 is formed in such a manner that the ink jetting was performed with droplets having an amount of 3 pl each, and then the active matrix substrates 1 and 101 were sintered at 120° C. for 30 minutes. In a liquid crystal display device including the active matrix substrate 101 of the first conventional art, flicker was observed. On the contrary, in a liquid crystal display device including the active matrix substrate 1 of the present embodiment, it was observed that a flicker occurred much less than in the conventional liquid crystal display device including the active matrix substrate 101.

The drain electrode 6 and the source electrode 7 of the TFT 13 of the present embodiment are such that that portion of the drain electrode 6 which is formed above the gate electrode 11 of the TFT 13 is interleaved within portions of the source electrode 7 which are formed above the gate electrode 11, and those portions of the source electrode 7 and the drain electrode 6 which are formed above the gate electrode 11 are surrounded by the semiconductor layer 5 (when seeing from above) by a sufficient margin. Further, this arrangement is such that the source electrode 7 has the parts to be counter parts for the drain electrode 6, the drain electrode 6 being interleaved with the parts.

Note that the arrangements of the present embodiment are applicable not only to a liquid crystal display device, but also to a display device including, for example, an organic EL, or an inorganic EL. In this case, the same effect can be obtained.

The following description discusses another embodiment of the present invention with reference to figures.

In the present embodiment, an active matrix substrate 1 is manufactured in accordance with the same method in the foregoing embodiment.

Next, description of the active matrix substrate 1 is made with reference to FIGS. 5(a), 5(b), 6, 7(a), 7(b), and 8.

Figure 5:
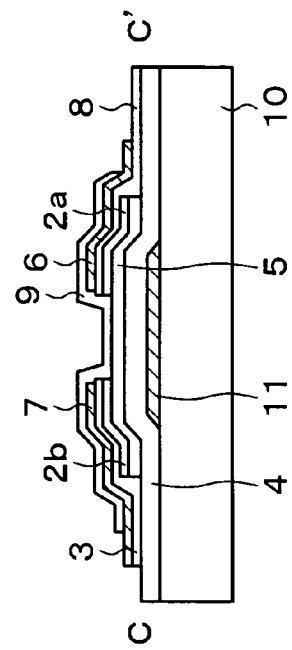
FIG. 5(a) is a perspective plan view illustrating still another structure of the active matrix substrate of the present invention.
FIG. 5(b) is an explanatory view showing a cross section taken along line C-C' in FIG. 5(a).
Figure 5:
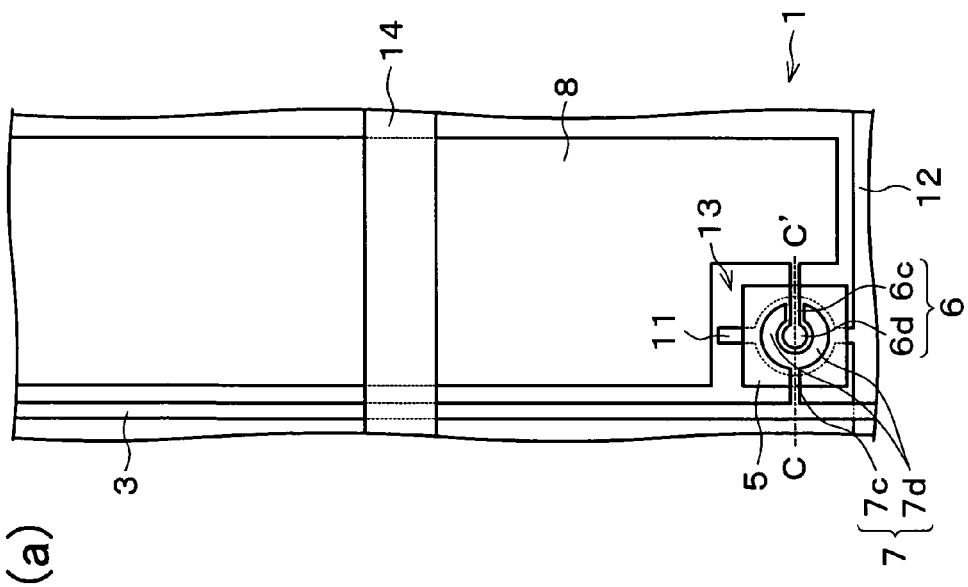
Figure 6:
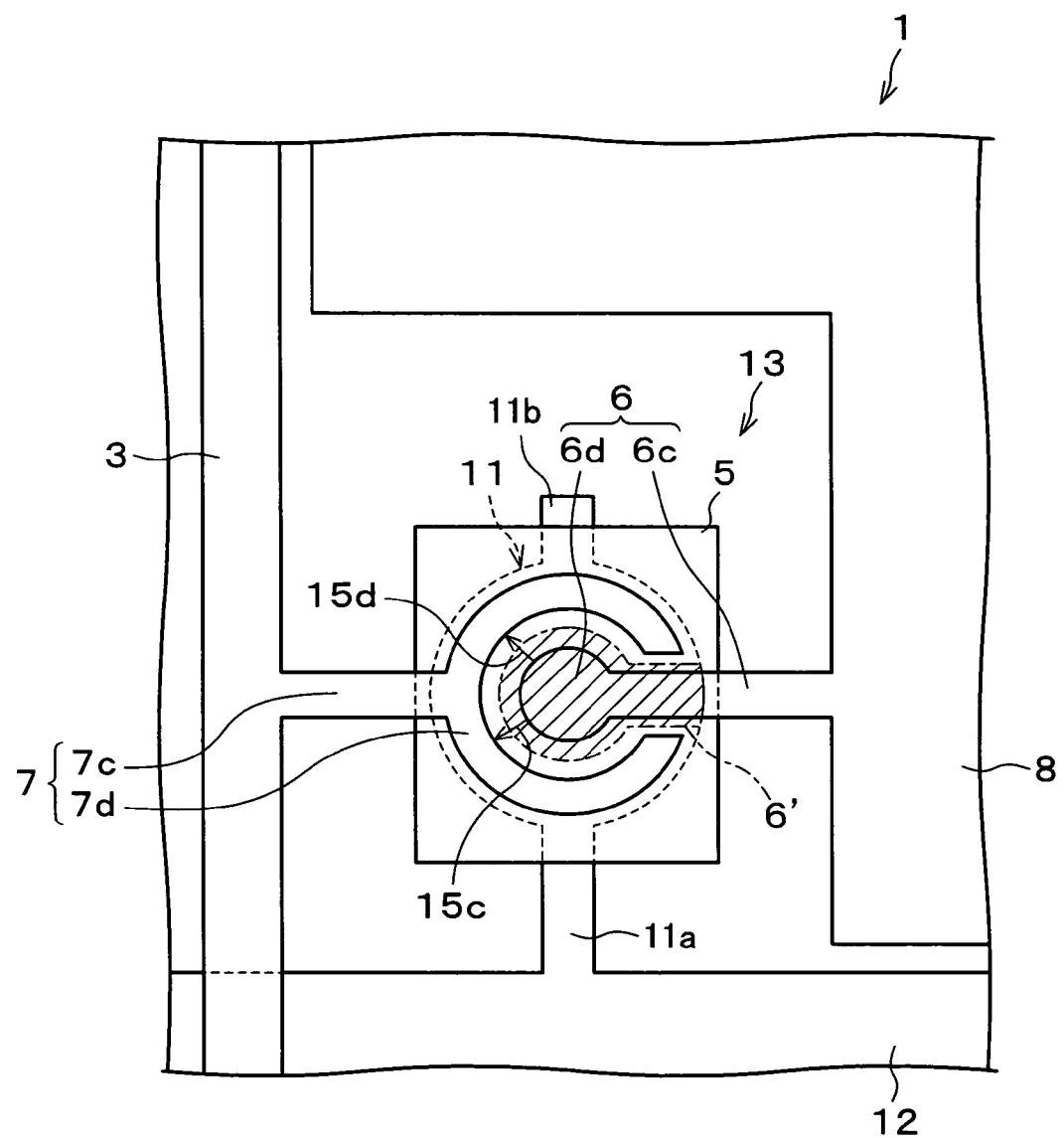
FIG. 6 is an enlarged perspective plan view illustrating the structure of a TFT of the matrix substrate shown in FIG. 5(a).

Here, FIG. 5(a) is a perspective plan view illustrating the active matrix substrate 1 of the present invention. FIG. 5(b) is an explanatory view showing a cross section taken along line C-C' in the FIG. 5(a). FIG. 6 is an enlarged perspective plan view illustrating a TFT (thin film transistor) 13 of the active matrix substrate 1 shown in FIG. 5(a).

As shown in FIGS. 5(a), 5(b), and 6, the active matrix substrate 1 is so arranged that, on a transparent insulation substrate 10 (shown in FIG. 5(b)), a signal line 3, a scanning line 12, a pixel electrode 8, a gate electrode 11, a semiconductor layer 5, a drain electrode 6, a source electrode 7, and a Cs (storing capacitor) 14 serving as an additional capacitor are provided.

The signal line 3 and the scanning line 12 cross with each other. In the vicinity of their intersection, the TFT (thin film transistor) 13 having three terminal elements (the gate electrode 11, the drain electrode 6, and the source electrode 7) is formed. The TFT 13 is between the signal line 3 and the pixel (sub pixel) electrode 8. That is, the TFT 13 is surrounded by the scanning line 12, the signal line 3, and the pixel electrode 8.

In the TFT 13, the gate electrode 11 is formed on the transparent insulation substrate 10, and a gate insulation film 4 is formed on the gate electrode 11. On the gate insulation film 4, the semiconductor layer 5 having a rectangular shape is formed. On the semiconductor layer 5, n-type semiconductor layers 2a and 2b are formed. On the n-type semiconductor layer 2a, the drain electrode 6 is formed, whereas on the n-type semiconductor layer 2b, the source electrode 7 is formed. The drain electrode 6 and the source electrode 7 are connected to the pixel electrode 8 and the source electrode 7, respectively. Further, on the drain electrode 6 and the source electrode 7, an interlayer insulation film 9 is so formed that the interlayer insulation film 9 covers the drain electrode 6 and the source electrode 7.

Here, the drain electrode 6 of the TFT 13 in the present embodiment has a matchstick-like shape as shown in FIG. 6. Specifically, the drain electrode 6 has a slender rectangular portion 6c and a circular portion 6d. The rectangular portion 6c extends, from the pixel electrode 8, along a direction of the scanning line 12, and the circular portion 6d is provided on an end portion of the rectangular portion 6c.

The source electrode 7 has a slender rectangular portion 7c, and a C-shape portion 7d. The rectangular portion 7c extends from the signal line 3, toward the pixel electrode 8, along the direction of the scanning line 12. The C-shape portion 7d curvedly extends, from an end portion of the rectangular portion 7c, in two directions so as to surround the circular portion 6d of the drain electrode 6.

Specifically, the circular portion 6d of the drain electrode 6 is formed interleaved within the C-shape portion 7d. (Therefore, the area surrounded by the C-shape portion 7d of the source electrode 7 is the drain electrode formation region.) The C-shape portion 7d has a "mouth," via which the rectangular portion 6c connects the pixel electrode 8 to the circular portion 6d. Further, the gate electrode 11 is formed in a circular shape of a sufficient dimension such that the C-shape portion 7d of the source electrode 7 will be within the gate electrode 11 (when viewed from above) (In other words, the gate electrode 11 has a sufficient margin such that it surrounds the C-shape portion 7d). Above the gate electrode 11, the semiconductor layer 5 is so formed in a quadrangular (rectangular) shape of a sufficient dimension such that the C-shape portion 7d of the source electrode 7 will be within the semiconductor layer 5 (when seen from above) (In other words, the semiconductor layer 5 has a sufficient margin such that it surrounds the C-shape portion 7d). Note that the gate electrode 11 is connected to the scanning line 12.

In the arrangement, the gate electrode 11 controls an electric conduction between the C-shape portion 7d of the source electrode 7 and the drain electrode 6. For example, when voltage is applied to the gate electrode 11 via the scanning line 12, channel having various directions (for example, as indicated by arrows 15c and 15d in FIG. 6) are formed via the n-type semiconductor layers 2a and 2b (shown in FIG. 5(b)), thereby attaining electric conduction between the drain electrode 6 and the source electrode 7.

Figure 11:
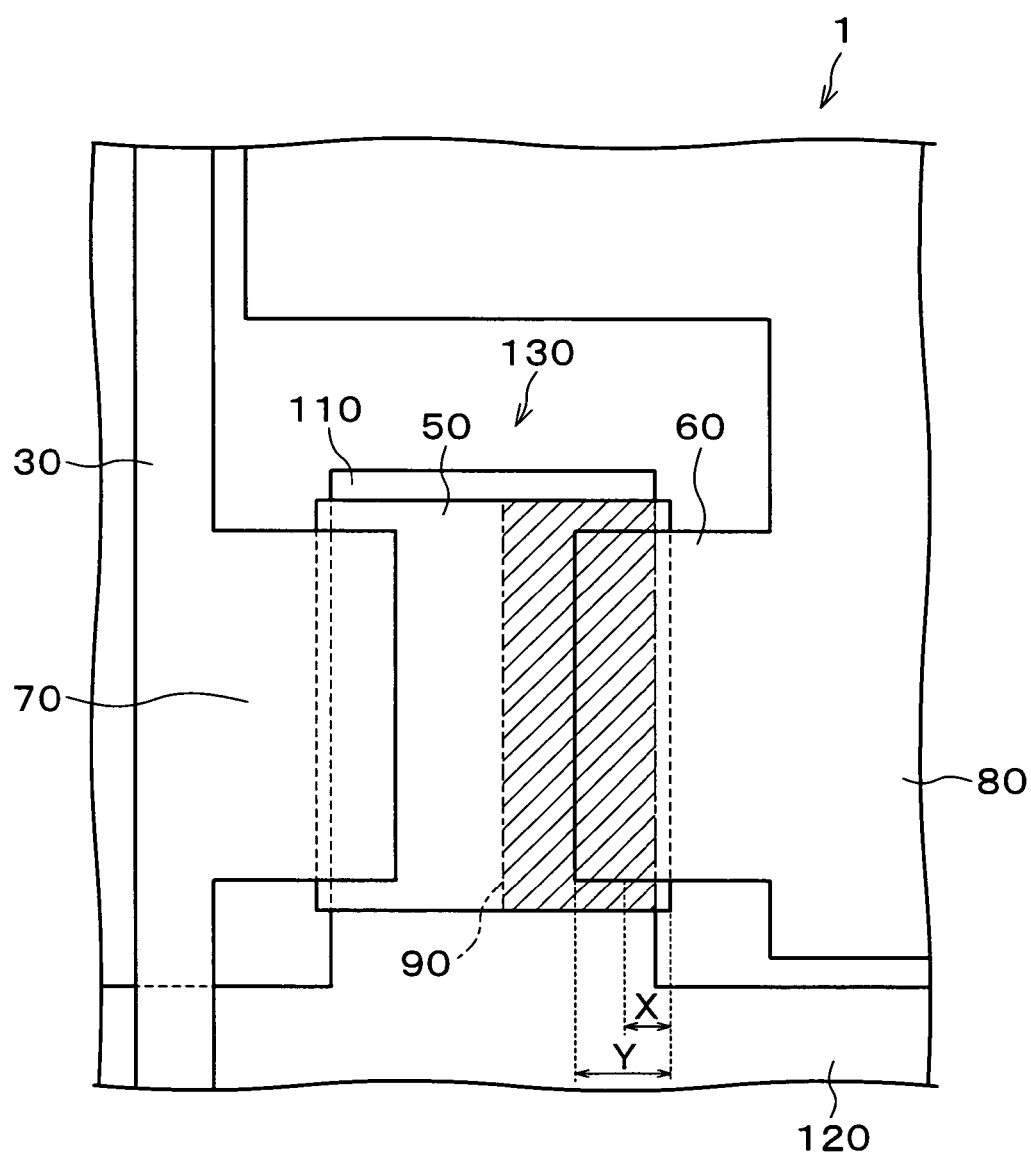
FIG. 11 is an enlarged perspective plan view illustrating a structure of a TFT of the matrix substrate shown in FIG. 10(a).
Figure 12:
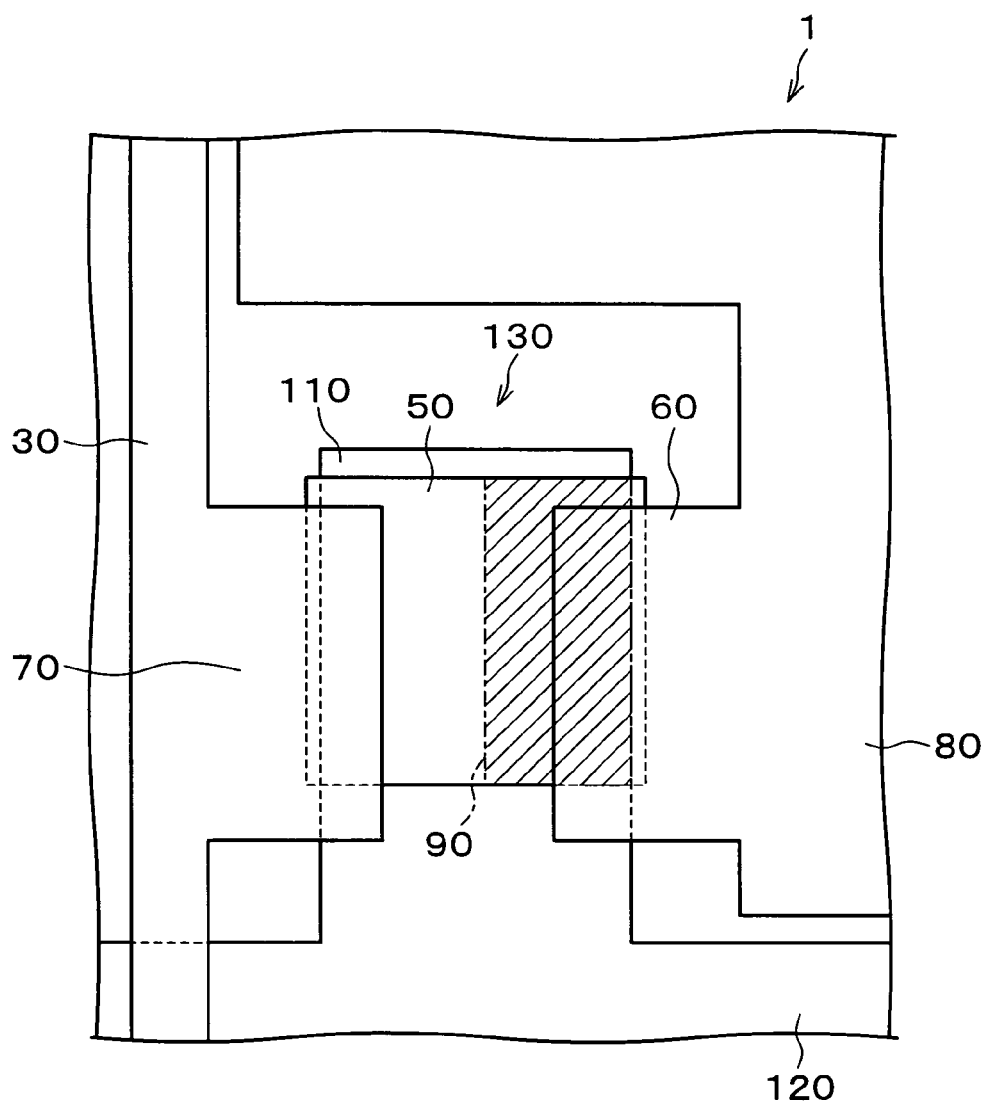
FIG. 12 is a perspective plan view illustrating a change in size of a semiconductor layer of the active matrix substrate shown in FIG. 10(a).
Figure 13:
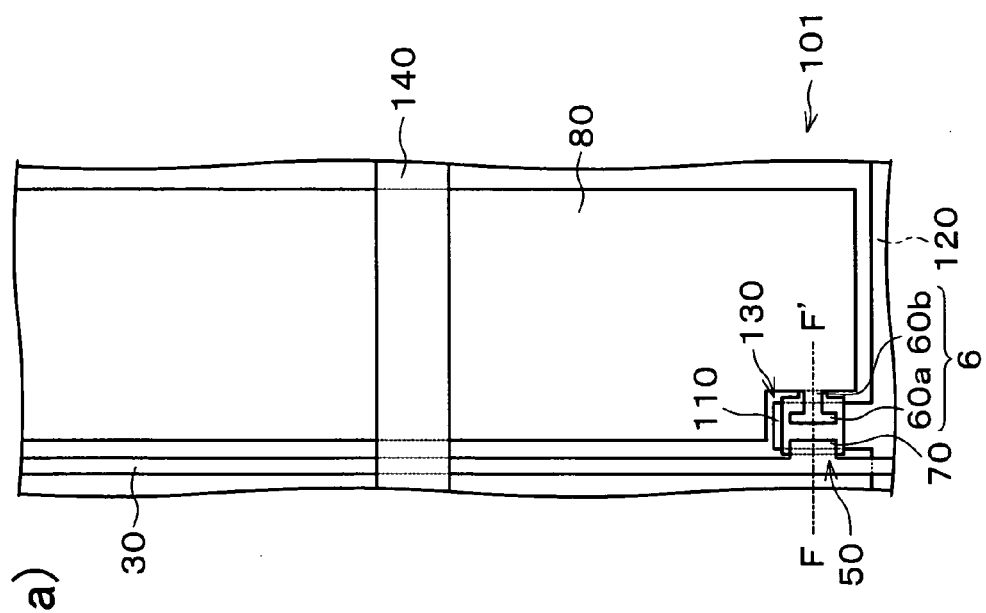
FIG. 13(a) is a perspective plan view illustrating a structure of an active matrix substrate of the first conventional art.
FIG. 13(b) is an explanatory view showing a cross section taken along line F-F' in FIG. 13(a).
Figure 13:
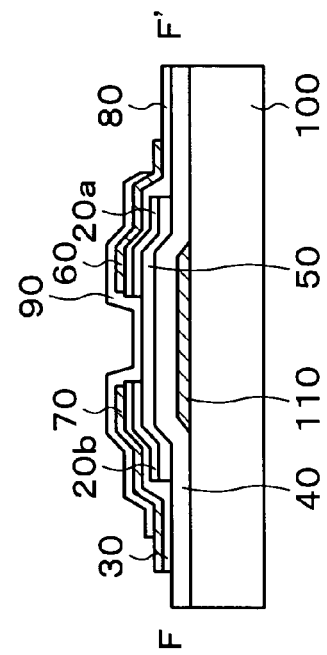
Figure 14:
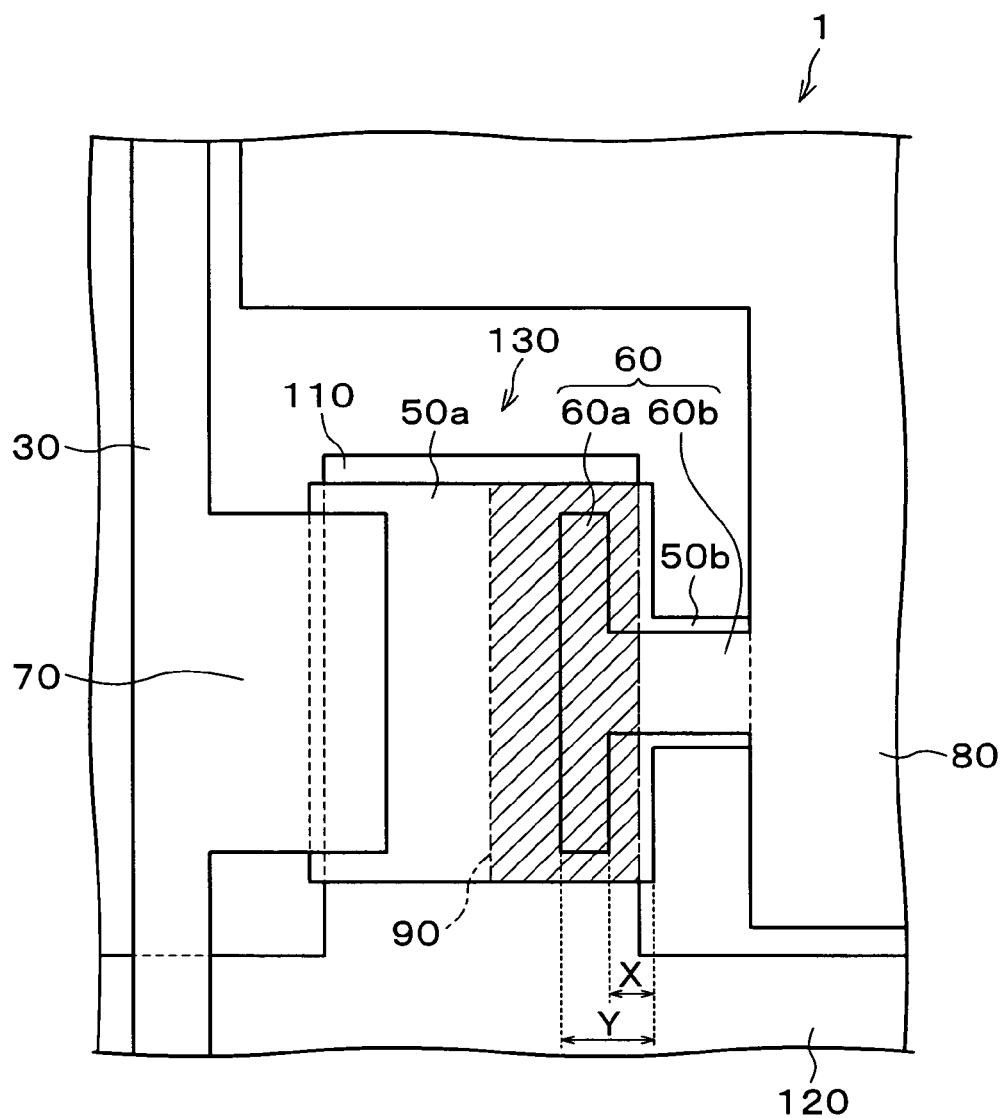
FIG. 14 is an enlarged perspective plan view illustrating a structure of a TFT of the matrix substrate shown in FIG. 10(a).
Figure 15:
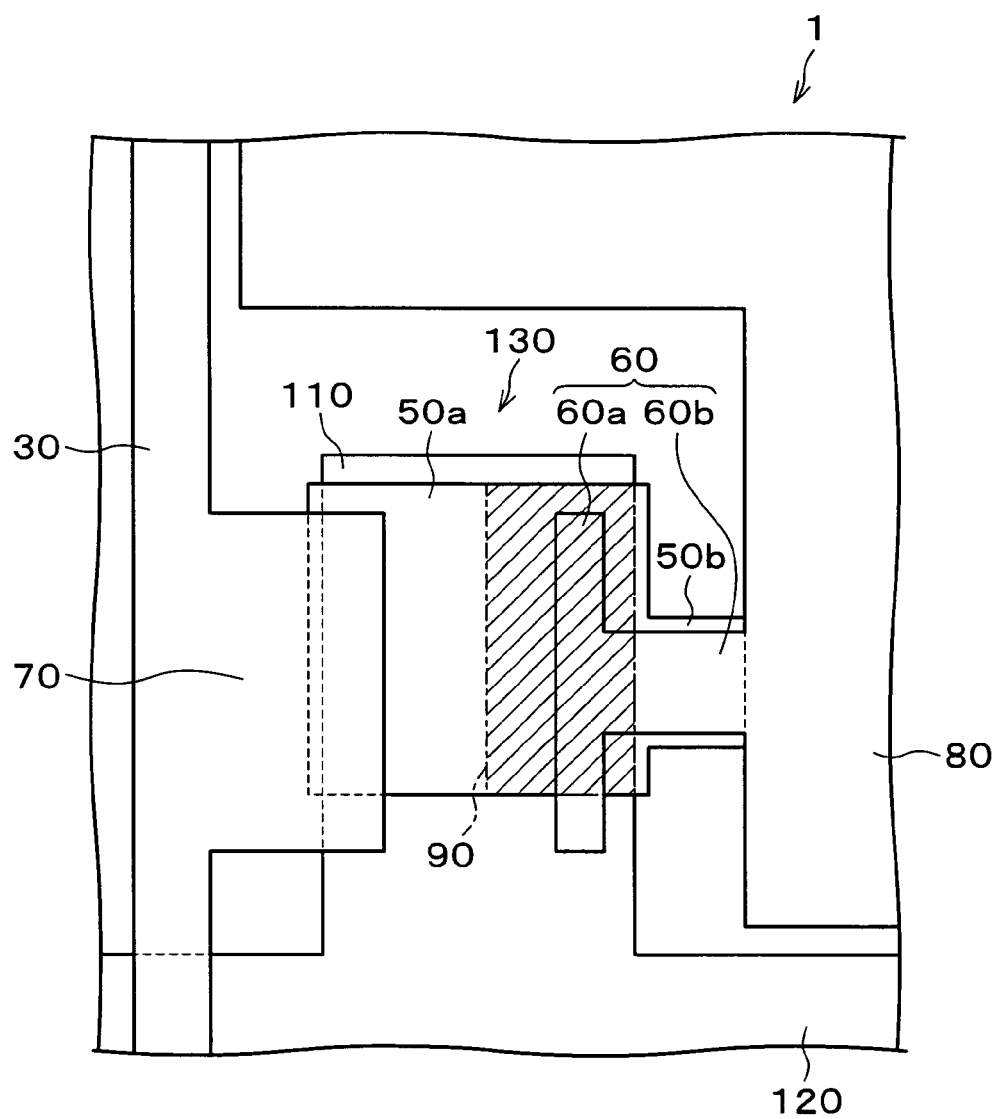
FIG. 15 is a perspective plan view illustrating a change in size of a semiconductor layer of the active matrix substrate shown in FIG. 13(a).

According to the present embodiment, the cgd contribution region 6'—i.e., the region that includes (a) those portions of the drain electrode 6 and the gate electrode 11 which overlap with each other, and (b) a vicinity of those portions—is smaller in size than those in the aforementioned conventional arts (shown in FIG. 11 and FIG. 14), and is disposed in a region that corresponds to the central portion of the semiconductor layer 5 as shown in FIG. 6. With this arrangement, even when the size and/or the shape of the semiconductor layer 5 is deviated, or the formation position of the semiconductor layer 5 is shifted, it is possible to avoid a change in the area of the cgd contribution region 6'.

Further, in the arrangement, the cgd contribution region 6' (the region that includes (a) those portions of the drain electrode 6 and the gate electrode 11 which overlap with each other, and (c) a vicinity of those portions) is interleaved within the portions 7a and 7b of the source electrode 7, thereby stabilizing the cgd contribution region 6'.

Further, in the arrangement, the cgd contribution region 6' has a certain distance from each edge of the semiconductor layer 5 (when viewed from above). On this account, even when the size and/or the shape of the semiconductor layer 5 is deviated, or the formation position of the semiconductor layer 5 is shifted, the area of the cgd contribution region 6' can be substantially prevented from changing.

Further, because the circular portion 6d of the drain electrode 6 is surrounded by the C-shape portion 7d of the source electrode 7, the channel is effectively formed on the periphery of the circular potion 6d of the drain electrode 6, thereby downsizing the TFT 13.

In the present embodiment, as shown in FIG. 6, the gate electrode 11 extends from the scanning line 12 to the formation region of the semiconductor layer 5, and has a connecting portion (initial end portion) 11a, and a top end potion (final end portion) 11b. The connecting portion 11a is connected to the scanning line 12. The top end potion 11b and the connecting portion 11a sandwich the drain electrode 6 between them. Namely, the gate electrode 11 is so arranged that the connecting portion 11a and the top end portion 11b do not overlap with the semiconductor layer 5. On this account, the semiconductor layer 5 has areas, under which the gate electrode 11 is not formed, one of the areas located toward the drain electrode 6, and the other area located toward the source electrode 7 (thus, the semiconductor layer 5 is so arranged that the areas thereof under which the gate electrode 11 is not formed is divided by the area thereof under which the gate electrode 11 is formed). This prevents leakage between the drain electrode 6 and the source electrode 7, and avoids electrical change of the pixel electrode 8 even when the resistance of the semiconductor layer 5 is decreased by light emitted from a back lighting device or the like.

Here, the active matrix substrate 1 having a structure of the present embodiment, and the active matrix substrate 101 (shown in FIG. 10(a)) having a structure of the aforementioned first conventional art were manufactured. In each of them, the size and the formation position of the semiconductor layer 5 (50) were intentionally deviated. Specifically, one side of the semiconductor layer 5 or 50 was shifted in a length of ±3 µm from its designed value, and its formation position was shifted in a length of ±3 µm in any direction from its designed value.

In a liquid crystal display device including the active matrix substrate 101 of the first conventional art, flicker was observed. On the contrary, in a liquid crystal display device including the active matrix substrate 1 of the present embodiment, it was observed that a flicker occurs much less than in the conventional liquid crystal display device including the active matrix substrate 101.

Further, in the present embodiment, the TFT 13 was approximately 10% smaller in area than the first conventional art, because the circular shape (C-shape) of the source electrode 7 ensured the channel to be effectively formed on the periphery of the drain electrode 6 so that the source electrode 7 and the semiconductor layer 5 were downsized.

Therefore, the arrangement of the TFT 13 can be described that that portion of the source electrode 7 which is formed above the gate electrode 11 of the TFT 13 is formed to surround that portion of the drain electrode 6 which is formed above the gate electrode 11, and the semiconductor layer 5 is so formed that the source electrode 7 and the drain electrode 6 are surrounded by the semiconductor layer 5 by a size margin (when viewed from above). Further, this arrangement can be described that those portions of the drain electrode 6 and the source electrode 7 which are in the vacinity of the channel have the circular shapes.

Note that the semiconductor layer 5 is not limited to the quadrangle (rectangle) shape, and may have a circular shape or elliptical shape. It is possibly much easier to form the semiconductor layer 5 having a circular shape than the semiconductor layer 5 having a quadrangular (rectangular) shape when the resist pattern is formed by using the ink jet printing so as to pattern the semiconductor layer 5.

Figure 7:
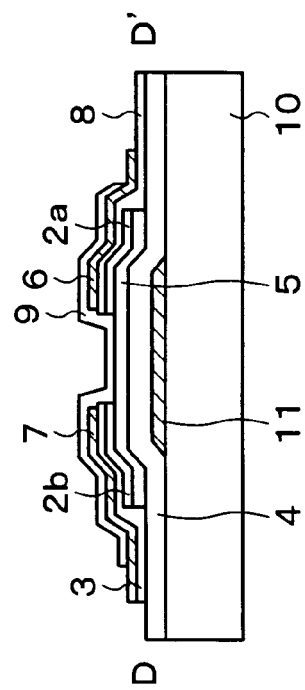
FIG. 7(a) is a perspective plan view illustrating yet another structure of the active matrix substrate of the present invention.
FIG. 7(b) is an explanatory view showing a cross section taken along line D-D' in FIG. 7(a).
Figure 7:
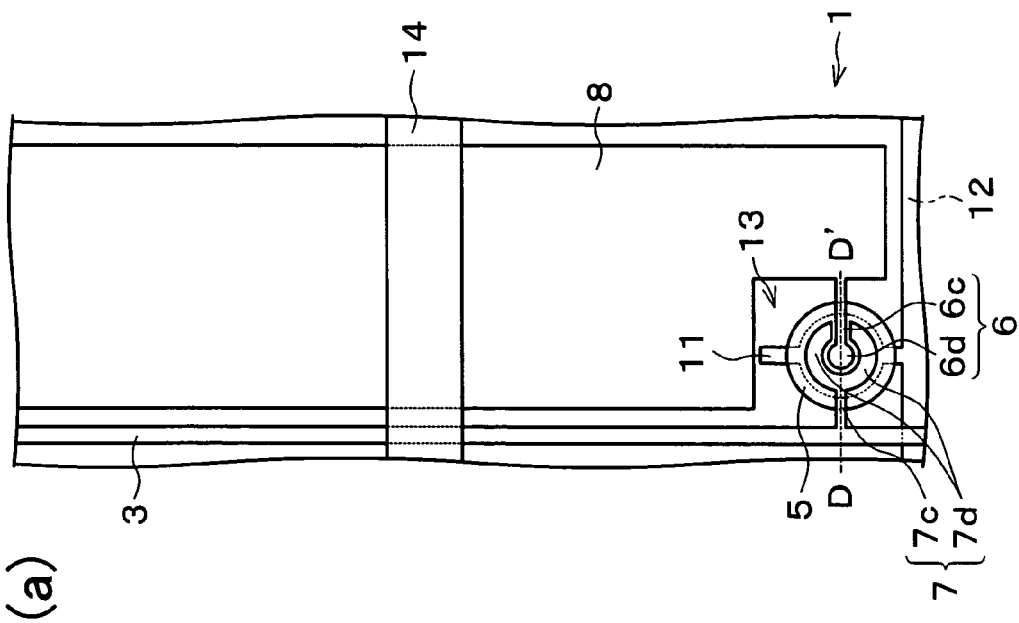
Figure 8:
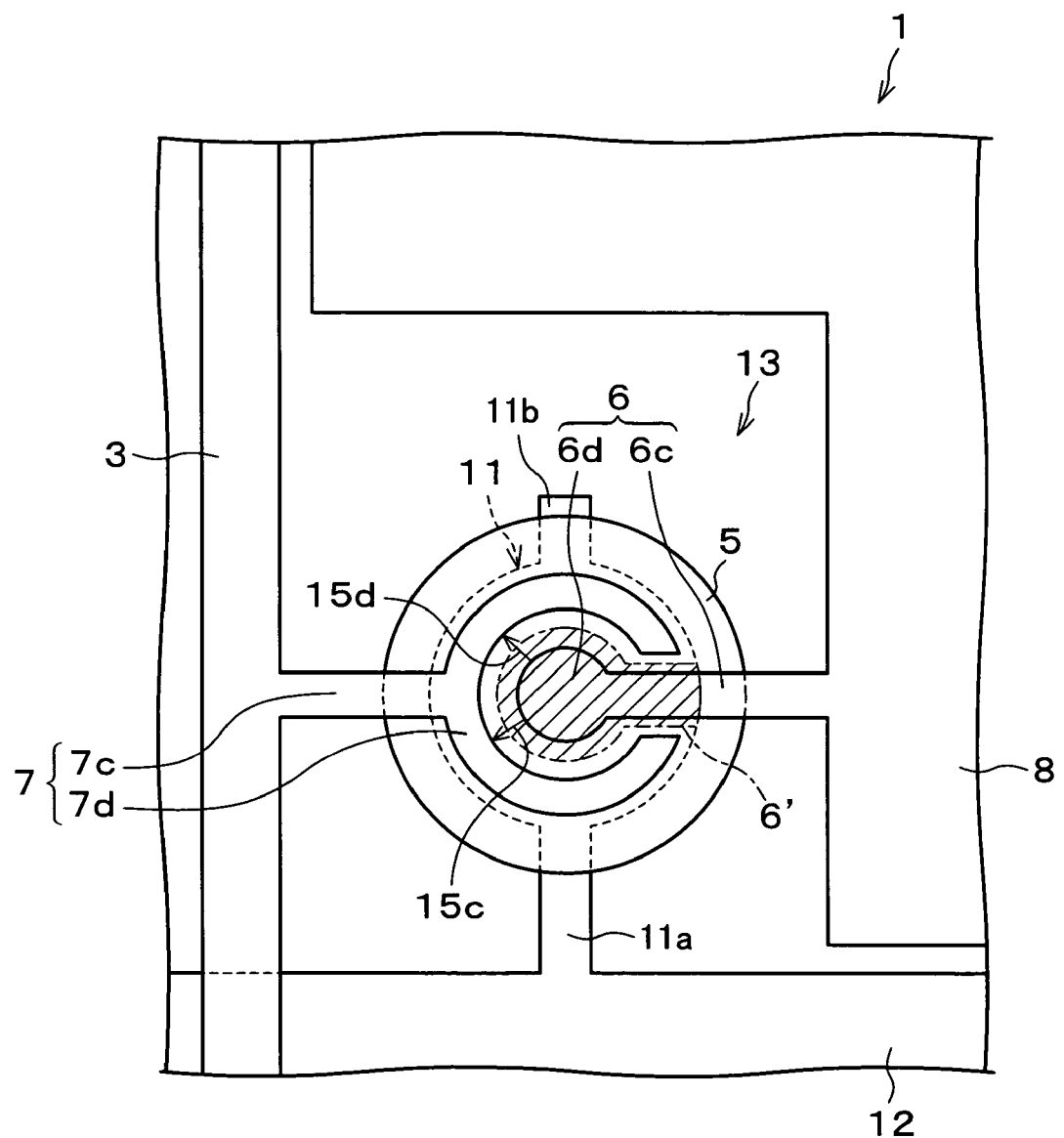
FIG. 8 is an enlarged perspective plan view illustrating the structure of a TFT of the matrix substrate shown in FIG. 7(a).

The arrangement in which the semiconductor layer 5 has a circular shape in the present embodiment is shown in FIGS. 7(*a*), 7(*b*), and 8. FIG. 7(*a*) is a perspective plan view illustrating a structure of the active matrix substrate 1 of the present embodiment. FIG. 7(*b*) is an explanatory view showing a cross section taken along line D-D' in the FIG. 7(*a*). FIG. 8 is an enlarged perspective plan view illustrating a TFT (thin film transistor) 13 of the active matrix substrate 1 shown in FIG. 7(*a*).

In this case, the TFT 13 has a lamination structure same as in the foregoing arrangement, as shown in FIG. 7(*b*). The source electrode 7 and the drain electrode 6 have the same shapes as those in the arrangement, respectively. Specifically, the drain electrode 6 has the circular portion 6*d* and the rectangular portion 6*c*, and the source electrode 7 has the C-shape portion 7*d*. The circular portion 6*d* of the drain electrode 6 is formed interleaved within the C-shape portion 7*d* that has a "mouth," via which the rectangular portion 6*c* connects the pixel electrode 8 to the circular portion 6*d*. Further, the gate electrode 11 extended from the scanning line 12 has a circular shape of a sufficient dimension such that the C-shape portion 7*d* of the source electrode 7 will be within the gate electrode 11 (when viewed from above) (in the other words, the gate electrode 11 has a sufficient margin such that it surrounds the C-shape portion 7*d*).

Further, as shown in FIG. 8, the cgd contribution region 6' (the region that includes (a) those portions of the drain electrode 6 and the gate electrode 11 which overlap with each other, and (c) a vicinity of those portions) is sandwiched between the portions 7*a* and 7*b* of the source electrode 7, thereby securing the cgd contribution region 6'.

Further, in the arrangement, the cgd contribution region 6' has a certain distance from each end of the semiconductor layer 5 (when viewed from above). On this account, even when the size and/or the shape of the semiconductor layer 5 is deviated, or the formation position of the semiconductor layer 5 is shifted, the area of the cgd contribution region 6' can be substantially prevented from changing.

In this arrangement, the semiconductor layer 5 having a circular shape is formed above the gate electrode 11, the semiconductor layer 5 being of sufficient dimension such that the C-shape portion 7*d* of the source electrode 7 will be within the semiconductor layer 5 (when seen from above).

Because the semiconductor layer 5 thus has a circular shape, the formation of the resist pattern by using the ink jet printing can be easily performed in the step of forming the semiconductor layer 5.

Meanwhile, in the case where a conventional arrangement is arranged such that a semiconductor layer 5 has a circular shape as shown in FIG. 16, the gate-drain capacitance cgd is greatly varied when the size and the position of the semiconductor layer 50 is deviated. The variation in the gate-drain capacitance cgd causes flicker.

On the contrary, in the present embodiment, because the circular portion 6*d* of the drain electrode 6 is formed interleaved within the C-shape portion 7*d* of the source electrode 7, the cgd contribution region 6' is smaller in size than the conventional arrangement, and is disposed in a region that corresponds to the central portion of the circle of the semiconductor layer 5. (The cgd contribution region 6' is region that includes (a) those portions of the drain electrode 6 and the gate electrode 11 which overlap with each other, and (c) a vicinity of those portions. On this account, even when the size and/or the shape of the semiconductor layer 5 is deviated, or the formation position of the semiconductor layer 5 is deviated in any direction, the area of the cgd contribution region 6' can be significantly prevented from changing.

Here, the active matrix substrate 1 of the present embodiment, and the active matrix substrate 101 (shown in FIG. 10(*a*)) of the first conventional art were manufactured. In the active matrix substrates 1 and 101, the resist pattern was formed, by using the ink jet printing, so as to form the semiconductor layer 5 having a circular shape.

Note that the resist pattern of the semiconductor layer 5 was formed in such a manner that the ink jetting is performed with droplets having an amount of 3 pl each, and then the active matrix substrates 1 and 101 were sintered at 120° C. for 30 minutes. In a liquid crystal display device including the active matrix substrate 101 of the first conventional art, flicker was observed. On the contrary, in a liquid crystal display device including the active matrix substrate 1 of the present embodiment, it was observed that a display defect caused by flicker was much less than the liquid crystal display device including the active matrix substrate 101.

Further, in the present embodiment, the TFT 13 was a approximately 13% smaller in area than the first conventional art because the formation region of the semiconductor layer 5 was further reduced than the arrangement of FIG. 6. The reduction in the area of the TFT 13 was attained due to the arrangement in which the semiconductor layer 5 was allowed to have a smaller area because the semiconductor layer 5 had the circular shape whose margin surrounds the C-shape portion 7*d* so that the C-shape portion 7*d* could be kept within the semiconductor layer (when seeing from above).

Note that the arrangements of the present embodiment are applicable not only to a liquid crystal display device, but also to a display device including, for example, an organic EL, or an inorganic EL. In this case, the same effect can be obtained.

Note also that, in the embodiments, the drain electrode 6 and the source electrode 7 may be a source contact and a drain contact, respectively.

Further, the active matrix substrate 1 of the embodiments (present invention) is not limited to the foregoing arrangements. The active matrix substrate 1 may be arranged so that the active element (TFT 13) and the lattice-arranged wires (the signal line 3 and the scanning line 12) are covered with an interlayer insulation film, and the pixel electrode 8 is formed on the interlayer insulation film. (For example, an interlayer insulation film may be formed between the wires (the signal line 3 and the scanning line 12) and the pixel electrode (picture element electrode) 8, whereby the wires (the signal line 3 and the scanning line 12) and the pixel electrode 8 are formed on different planes with the interlayer insulation film disposed therebetween.)

Further, in the embodiments, the drain electrode 6, which extends from the pixel electrode 8 to the drain electrode formation region, may have such a shape that the drain electrode 6 is partially straight and partially curved, or such a shape that the drain electrode 6 is wholly curved. The drain electrode formation region includes a region between the parts 7*a*' and 7*b*' of the source electrode 7 in the arrangement of FIG. 2 and FIG. 4, and a region within the C-shape portion 7*d* of the source electrode 7 in the arrangement of FIG. 6 and FIG. 8.

Further, the embodiments are not limited to the arrangement in which the initial end portion (connecting potion connected to the scanning line 12) 11*a* of the gate electrode 11 faces its final end portion 11*b*. For example, the gate electrode 11 may be partially straight and partially curved to such an extent that the final end portion 11*b* does not face the initial end portion 11*a*. Alternatively, the gate electrode 11 may be wholly curved to the extent.

The arrangement of the present invention can be described as an active matrix substrate 1 that includes: (i) a plurality of scanning lines 12 that are formed on a substrate 10, and that are parallel to one another; (ii) a plurality of signal lines 3 that orthogonally cross with the scanning lines 12, an interlayer insulation film 4 being sandwiched between the signal lines 3 and the scanning lines 12; (iii) a thin film transistor 13 provided in a vicinity of each intersection of the scanning lines 12 and the signal lines 3, wherein: a drain electrode 6 is formed above a gate electrode 11 of the thin film transistor 13, and is surrounded by a source contact 7 formed above the gate electrode 11, and the source contact 7 and the drain contact 6 are kept within a semiconductor layer 5 when seeing from above, and the semiconductor has areas under which the gate electrode 11 is not formed, one of the areas being associated with the source, and the other area being associated with the drain.

Further, the arrangement of the present invention can be described as an active matrix substrate 1 that includes: (i) a scanning line 12 that includes a gate electrode 11, and that is formed on a substrate 10; (ii) a thin film transistor 13 including a semiconductor layer 5 formed above the gate electrode, a source electrode 7, and a drain electrode 6, the source electrode 7 and the drain electrode 6 being formed within the semiconductor layer 5 when seeing from above; (iii) a signal line 3 that is connected to the source electrode 7, and that crosses with the scanning line 12; and (iv) a pixel electrode 8 connected to the drain electrode 6, wherein that portion of the drain electrode 6 which is above the gate electrode 11 of the transistor 13 is surrounded by margins of the source contract 7 formed above the gate electrode, and the semiconductor layer 5 has a shape whose size is of margin so as to surround (a) that portion of the source contact 7 which is above the gate electrode 11, and (b) that portion of the drain contact 6 which is above the gate electrode 11 (in other words, the semiconductor layer 5 has a sufficient dimension that those portions can be kept within the semiconductor layer 5 when viewed from above.)

The arrangement of the present invention is such that an active matrix substrate 1 includes: (i) a scanning line 12 that is formed on the substrate 10, and that includes a gate electrode 11; (ii) a thin film transistor 13 including a semiconductor layer 5 formed above the gate electrode 11, a source electrode 7 and a drain electrode 6, the source electrode 7 and the drain electrode 6 being formed interleaved within the semiconductor layer 5 when seeing from above; (iii) a signal line 3 that is connected to the source electrode 7, and that crosses with the scanning line 12; and (iv) a pixel electrode 8 connected to the drain electrode 6, wherein: the drain electrode 6 extends, from the connecting portion to a formation region of the semiconductor layer 5, and has a strip-like shape, and has a portion juxtaposed with the source electrode 7 extending from the signal line 3.

In the arrangement, the portions of the drain electrode 6 and the source electrode 7 are interleaved with one another, in a direction orthogonal to such a direction that the drain electrode 6 extends. Among the portions, the channel is formed.

Further, a region (cgd contribution region) includes (a) those portions of the drain electrode 6 and the gate electrode 11 which overlaps with each other, and (b) a vicinity of those portions (i.e., a region constituted of (i) those portions of the gate electrode 11, the drain electrode 6, and the semiconductor layer 5 in which they overlap with one another, and (ii) a vicinity of their portions). With the above mentioned arrangement, the cgd contribution region of the present invention becomes smaller in size than those in the aforementioned conventional arts, and is disposed in a region that corresponds to the central portion of the semiconductor layer 5. On this account, even when the size, the shape, or the formation position of the semiconductor layer is changed, the area of the cgd contribution region can be substantially prevented from changing.

This prevents the variance (unevenness) in the gate-drain capacitances cgd among the thin film transistors 13, thereby realizing a high display characteristic, the unevenness being caused by the formation accuracy of the semiconductor layer 5.

The active matrix substrate is preferably arranged so that the gate electrode extends from the scanning line to the semiconductor layer formation region, and has an initial end portion and a final end portion, which do not overlap with the semiconductor layer.

The active matrix substrate preferably further includes the drain electrode formation region is interleaved with the plurality of portions of the source electrode, the plurality of portions having a strip-like shape; and the drain electrode has a strip-like shape in the drain electrode formation region.

The active matrix substrate is preferably arranged so that the source electrode has a portion having a substantially C-shape, and the portion surrounds the drain electrode formation region.

The active matrix substrate is preferably arranged so that the semiconductor layer has a circular shape.

Further, a display device of the present invention includes the active matrix substrate.

Note that the gate electrode, which extends from the scanning line to the formation region of the semiconductor layer, may have such a shape that, for example, the gate electrode is wholly straight from its initial end portion to its final end portion, or that the initial end portion and the final end portion have a strip-like shape, and the other portion has a circular shape, or that the gate electrode is wholly curved from the initial end portion to the final end portion.

Moreover, the active matrix substrate of the present invention preferably so arranged that the drain electrode formation region is interleaved with the plurality of portions of the source electrode, the plurality of portions having a strip-like shape; and the drain electrode has a strip-like shape in the drain electrode formation region.

According to the arrangement, the drain electrode has a strip-like shape in the drain electrode formation region, which is within the formation region of the semiconductor layer when seen from above. On this account, the drain electrode can have a smaller width (a length in a direction orthogonal to such a direction that the drain electrode extends) than the conventional arts. Accordingly, it is possible to avoid the variance in the area of the cgd contribution region even when the size and/or the shape of the semiconductor layer is deviated, or the formation position of the semiconductor layer is shifted in the direction that the drain electrode extends.

In the arrangement, such a simple strip-like shape of the source electrode or the drain electrode makes it easier to form (pattern) the electrode.

As described above, the active matrix substrate may be arranged so that the source electrode has the portion having a substantially C-shape, and the portion surrounds the drain electrode formation region.

According to the arrangement, the channel is effectively formed in the periphery of the drain electrode, which is surrounded by the source electrode having C-shape.

This downsizes the formation regions of the source electrode (drain electrode) and of the semiconductor layer. Accordingly, the thin film transistor can be downsized.

As described above, the active matrix substrate may be arranged so that the semiconductor layer has a circular shape.

The arrangement makes it easier to form the semiconductor layer (the resist pattern of the semiconductor layer) by using ink jet printing.

Further, in the case where the source electrode has a circular shape (for example, C-shape) so as to surround the drain electrode formation region, the semiconductor layer requires only a minimum necessary dimension in order that the source electrode will be within the semiconductor layer (when viewed from above). Therefore, the formation region of the semiconductor layer can be smaller than that of the semiconductor layer having a quadrangle shape.

Note that the drain electrode, which extends from the pixel electrode to the drain electrode formation region, may have such a shape that the drain electrode is partially straight and is partially curved, or is wholly curved.

As described above, the active matrix substrate is preferably arranged so that the gate electrode extends from the scanning line to the semiconductor layer formation region, and has an initial end portion and a final end portion, and is so arranged that the initial end portion and the final end portion do not overlap with the semiconductor layer.

According to the arrangement, the semiconductor layer is so arranged that the areas thereof under which the gate electrode is not formed is divided by the area thereof under which the gate electrode is formed (one of the areas under which the gate electrode is not formed is located toward the signal line and the other is located toward the pixel electrode).

Therefore, for example, even when electric resistance is decreased due to irradiation of a light emitted from a back lighting device or the like onto the semiconductor layer including the areas (the areas under which the gate electrode is not formed), it is possible to prevent a leakage between the source electrode (signal line) and the drain electrode (pixel electrode). This avoids electrical change of the pixel electrode.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. An active matrix substrate, comprising:
   a scanning line on a substrate, the scanning line including a gate electrode;
   a thin film transistor including (a) a semiconductor layer formed above the gate electrode, (b) a source electrode, and (c) a drain electrode, the source electrode and the drain electrode being surrounded by a sufficient margin of the semiconductor layer such that the source electrode and the drain electrode overlap with the semiconductor layer, wherein a circular shape for the semiconductor layer is obtained by etching a circular resist pattern being circular due to a shape of droplets of ink jet printing;
   a signal line that is connected to the source electrode, and that crosses with the scanning line; and
   a pixel electrode connected to the drain electrode,
   wherein
   the drain electrode extended from the pixel electrode into a drain electrode formation region located to be kept within a semiconductor layer formation region, the drain electrode formation region sandwiched between a plurality of portions of the source electrode,
   the source electrode includes two acting parts having strip-like shapes protruding from the signal line, which is parallel to the gate line,
   the drain electrode includes an acting part having a strip-like shape which protrudes from the pixel electrode, which is parallel to the gate line, and is sandwiched by the acting parts of the source electrode,
   the gate electrode includes a part having a strip-like shape protruding from the gate line perpendicularly and overlapping with the acting parts of the source electrode and the acting part of the drain electrode,
   wherein the sufficient margin of the semiconductor layer includes a portion of the semiconductor layer that extends from a region that overlaps with substantially the entire area of the source electrode that surrounds the drain electrode to beyond outer edges of the outer perimeter of said area of the source electrode,
   wherein a Cgd region as a region consisting of portions of the drain electrode and the gate electrode that overlap each other is disposed in the central portion of the semiconductor layer having the circular shape, when viewed from the top.

2. The active matrix substrate as set forth in claim 1, wherein a width of the acting part of the source electrode is constant and a width of the acting part of the drain electrode is constant.

3. The active matrix substrate as set forth in claim 1, wherein an entire of the drain electrode is parallel to the scanning line.

4. The active matrix substrate as set forth in claim 1, wherein the drain electrode protrudes from a portion of the pixel electrode, the portion being opposite to the signal line.

5. The active matrix substrate as set forth in claim 1, wherein a distance between the pixel electrode and the scanning line is shorter than a distance between the drain electrode and the scanning line.

6. The active matrix substrate as set forth in claim 1, wherein the semiconductor layer does not overlap with the signal line.

7. The active matrix substrate as set forth in claim 1, wherein the semiconductor layer does not overlap with the pixel electrode.

8. The active matrix substrate as set forth in claim 1, wherein the semiconductor layer does not overlap with the scanning line.

9. The active matrix substrate as set forth in claim 1,
   wherein the relationship LB<LA is such that the front edge of the acting part of the drain electrode is set back from the pixel electrode,
   and there is provided a space between the gate electrode and the signal line, the space being a margin of a position of forming the semiconductor layer by ink jet printing.

10. The active matrix substrate as set forth in claim 1, wherein the gate electrode overlaps the whole acting parts of the source electrode.

11. The active matrix substrate as set forth in claim 10, wherein a portion of the gate electrode, which is parallel to the signal line, overlaps the whole acting parts of the source electrode.

12. The active matrix substrate as set forth in claim 1, wherein the front edge of the acting part of the drain electrode and an edge of the gate electrode facing the signal line are set back from an edge of the pixel electrode facing the signal line.

13. The active matrix substrate as set forth in claim 12, wherein a portion of the gate electrode, which is parallel to the signal line, overlaps the whole acting part of the drain electrode.

14. The active matrix substrate as set forth in claim 1, wherein a change in a gate-drain capacitance due to deviation of a size of the semiconductor layer or due to shift of a formation position of the semiconductor layer is reduced.

15. The active matrix substrate as set forth in claim 1, wherein a change in a gate-drain capacitance due to deviation of a diameter of the circular semiconductor layer or due to shift of a center position of the circular semiconductor layer is reduced.

16. The active matrix substrate as set forth in claim 1, wherein the margin of the semiconductor layer overlaps with none of the signal line, the pixel electrode or the scanning line.

17. The active matrix substrate as set forth in claim 1, wherein the gate electrode overlaps the whole acting part of the drain electrode.

18. The active matrix substrate as set forth in claim 1, wherein
length LA is a length of the gap region in a direction parallel to the gate line, the gap region being between the signal line and a front edge of the acting part of the drain electrode, which acting part is parallel to the gate line,
length LB is a length between the signal line and the pixel electrode in a direction parallel to the gate line, and
LA is longer than LB.

19. A method of manufacturing an active matrix substrate, the method comprising steps of:
forming a scanning line on a substrate, the scanning line including a gate electrode;
forming a thin film transistor including
forming a circular shaped semiconductor layer above the gate electrode, wherein the shape of the semiconductor layer is obtained by etching a circular resist pattern being circular due to a shape of droplets of ink jet printing,
forming a source electrode and a drain electrode, wherein the semiconductor layer is formed with a sufficient margin to surround the source electrode and the drain electrode such that the source electrode and the drain electrode overlap with the semiconductor layer;
forming a signal line that is connected to the source electrode, and that crosses with the scanning line; and
forming a pixel electrode connected to the drain electrode, wherein
the drain electrode extends from the pixel electrode into a drain electrode formation region located to be kept within a semiconductor layer formation region, the drain electrode formation region sandwiched between a plurality of portions of the source electrode,
the source electrode formed to include two acting parts having strip-like shapes protruding from the signal line, which is parallel to the gate line,
the drain electrode formed to include an acting part having a strip-like shape which protrudes from the pixel electrode, which is parallel to the gate line, and is sandwiched by the acting parts of the source electrode,
the gate electrode includes a part having a strip-like shape protruding from the gate line perpendicularly and overlapping with the acting parts of the source electrode and the acting part of the drain electrode,
wherein the sufficient margin of the semiconductor layer includes a portion of the semiconductor layer that extends from a region that overlaps with substantially the entire area of the source electrode that surrounds the drain electrode to beyond outer edges of the outer perimeter of said area of the source electrode,
wherein a Cgd region as a region consisting of portions of the drain electrode and the gate electrode that overlap each other is disposed in the central portion of the semiconductor layer having the circular shape, when viewed from the top.

20. The method of manufacturing an active matrix substrate as set forth in claim 19, wherein a width of the acting part of the source electrode is constant and a width of the acting part of the drain electrode is constant.

21. The method of manufacturing an active matrix substrate as set forth in claim 19, wherein an entire of the drain electrode is parallel to the scanning line.

22. The method of manufacturing an active matrix substrate as set forth in claim 19, wherein the drain electrode protrudes from a portion of the pixel electrode, the portion being opposite to the signal line.

23. The method of manufacturing an active matrix substrate as set forth in claim 19, wherein a distance between the pixel electrode and the scanning line is shorter than a distance between the drain electrode and the scanning line.

24. The method of manufacturing an active matrix substrate as set forth in claim 19, wherein the semiconductor layer does not overlap with the signal line.

25. The method of manufacturing an active matrix substrate as set forth in claim 19, wherein the semiconductor layer does not overlap with the pixel electrode.

26. The method of manufacturing an active matrix substrate as set forth in claim 19, wherein the semiconductor layer does not overlap with the scanning line.

27. The method of manufacturing an active matrix substrate as set forth in claim 19,
wherein the relationship LB<LA is such that the front edge of the acting part of the drain electrode is set back from the pixel electrode,
and there is provided a space between the gate electrode and the signal line, the space being a margin of a position of forming the semiconductor layer by ink jet printing.

28. The method of manufacturing an active matrix substrate as set forth in claim 19,
wherein the gate electrode overlaps the whole acting parts of the source electrode.

29. The method of manufacturing an active matrix substrate as set forth in claim 28,
wherein a portion of the gate electrode, which is parallel to the signal line, overlaps the whole acting parts of the source electrode.

30. The method of manufacturing an active matrix substrate as set forth in claim 19,
wherein the front edge of the acting part of the drain electrode and an edge of the gate electrode facing the signal line are set back from an edge of the pixel electrode facing the signal line.

31. The method of manufacturing an active matrix substrate as set forth in claim 30,
wherein a portion of the gate electrode, which is parallel to the signal line, overlaps the whole acting part of the drain electrode.

32. The method of manufacturing an active matrix substrate as set forth in claim 19, wherein a change in a gate-drain capacitance due to deviation of a size of the semiconductor layer or due to shift of a formation position of the semiconductor layer is reduced.

33. The method of manufacturing an active matrix substrate as set forth in claim 19, wherein a change in a gate-drain capacitance due to deviation of a diameter of the circular semiconductor layer or due to shift of a center position of the circular semiconductor layer is reduced.

34. The method of manufacturing an active matrix substrate as set forth in claim 19, wherein the margin of the semiconductor layer overlaps with none of the signal line, the pixel electrode or the scanning line.

35. The method of manufacturing an active matrix substrate as set forth in claim 19, wherein the gate electrode overlaps the whole acting part of the drain electrode.

36. The method of manufacturing an active matrix substrate as set forth in claim 19, wherein
- length LA is a length of the gap region in a direction parallel to the gate line, the gap region being between the signal line and a front edge of the acting part of the drain electrode, which acting part is parallel to the gate line,
- length LB is a length between the signal line and the pixel electrode in a direction parallel to the gate line, and
- LA is longer than LB.

* * * * *